(12) United States Patent
Shi et al.

(10) Patent No.: US 12,051,692 B2
(45) Date of Patent: Jul. 30, 2024

(54) INTEGRATED CIRCUIT STRUCTURE WITH FRONT SIDE SIGNAL LINES AND BACKSIDE POWER DELIVERY

(71) Applicant: Intel Corporation, Santa Clara, CA (US)

(72) Inventors: Quan Shi, Beaverton, OR (US); Sukru Yemenicioglu, Portland, OR (US); Marni Nabors, Portland, OR (US); Nikolay Ryzhenko, Beaverton, OR (US); Xinning Wang, Portland, OR (US); Sivakumar Venkataraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 655 days.

(21) Appl. No.: 17/176,412

(22) Filed: Feb. 16, 2021

(65) Prior Publication Data
US 2022/0262791 A1 Aug. 18, 2022

(51) Int. Cl.
*H01L 27/088* (2006.01)
*H01L 23/50* (2006.01)
*H01L 29/06* (2006.01)
*H01L 29/78* (2006.01)

(52) U.S. Cl.
CPC .......... *H01L 27/0886* (2013.01); *H01L 23/50* (2013.01); *H01L 29/0669* (2013.01); *H01L 29/785* (2013.01); *H01L 2029/7858* (2013.01)

(58) Field of Classification Search
CPC ............... H01L 27/9886; H01L 27/088; H01L 27/0207; H01L 27/11807; H01L 23/50; H01L 23/485; H01L 23/5286; H01L 23/5226; H01L 29/0669; H01L 29/785; H01L 29/0673; H01L 2029/7858;
(Continued)

(56) References Cited

U.S. PATENT DOCUMENTS 11,923,364 B2 * 3/2024 Liebmann ......... H01L 23/53271
2020/0266169 A1 8/2020 Kang et al.
2020/0328212 A1 10/2020 Guo-Huei et al.
(Continued)

OTHER PUBLICATIONS

European Search Report for European Patent Application No. 22150106.7 mailed Jun. 10, 2022, 9 pgs.
(Continued)

*Primary Examiner* — Dao H Nguyen
(74) *Attorney, Agent, or Firm* — Schwabe, Williamson & Wyatt, P.C.

(57) ABSTRACT

Integrated circuit structures having front side signal lines and backside power delivery are described. In an example, an integrated circuit structure includes a plurality of gate lines extending over a plurality of semiconductor nanowire stack or fin channel structures within a cell boundary. A plurality of trench contacts is extending over a plurality of source or drain structures within the cell boundary, individual ones of the plurality of trench contacts alternating with individual ones of the plurality of gate lines. A first signal line, a second signal line, a third signal line, and a fourth signal line are over the plurality of gate lines and the plurality of trench contacts within the cell boundary. A backside power delivery line is coupled to one of the plurality of trench contacts within the cell boundary.

22 Claims, 21 Drawing Sheets

(58) Field of Classification Search
CPC . H01L 2027/11875; H01L 2027/11879; H01L 2027/11881
See application file for complete search history.

(56) References Cited

U.S. PATENT DOCUMENTS

| | | | | |
|---|---|---|---|---|
| 2020/0411533 | A1* | 12/2020 | Alsmeier | H01L 29/42376 |
| 2022/0037192 | A1* | 2/2022 | Yu | H01L 21/76832 |
| 2022/0320115 | A1* | 10/2022 | Bae | H01L 29/41791 |
| 2022/0336330 | A1* | 10/2022 | Kim | H01L 21/823431 |
| 2022/0384589 | A1* | 12/2022 | Su | H01L 29/0673 |
| 2023/0253406 | A1* | 8/2023 | Wu | H01L 21/743 |
| | | | | 257/369 |
| 2024/0055493 | A1* | 2/2024 | Na | H01L 23/535 |

OTHER PUBLICATIONS

Hossen, Md Obaidul et al: "Power Delivery Network (PDN) Modeling for Backside-PDN Configurations With Buried Power Rails and μTSVs", IEEE Transactions on Electron Devices, IEEE, USA, vol. 67, No. 1, Jan. 2020 (Jan. 2020), pp. 11-17, XP011763433,ISSN: 0018-9383, DOI: 10.1109/TED.2019.2954301.

Prasad Divya et al: "Buried Power Rails and Back-side Power Grids: Arm CPU Power Delivery Network Design Beyond 5nm", 2019 IEEE International Electron Devices Meeting (IEDM), IEEE, Dec. 7, 2019 (Dec. 7, 2019), XP033714522, DOI: 10.1109/IEDMI. 9573. 2019.8993617.

\* cited by examiner

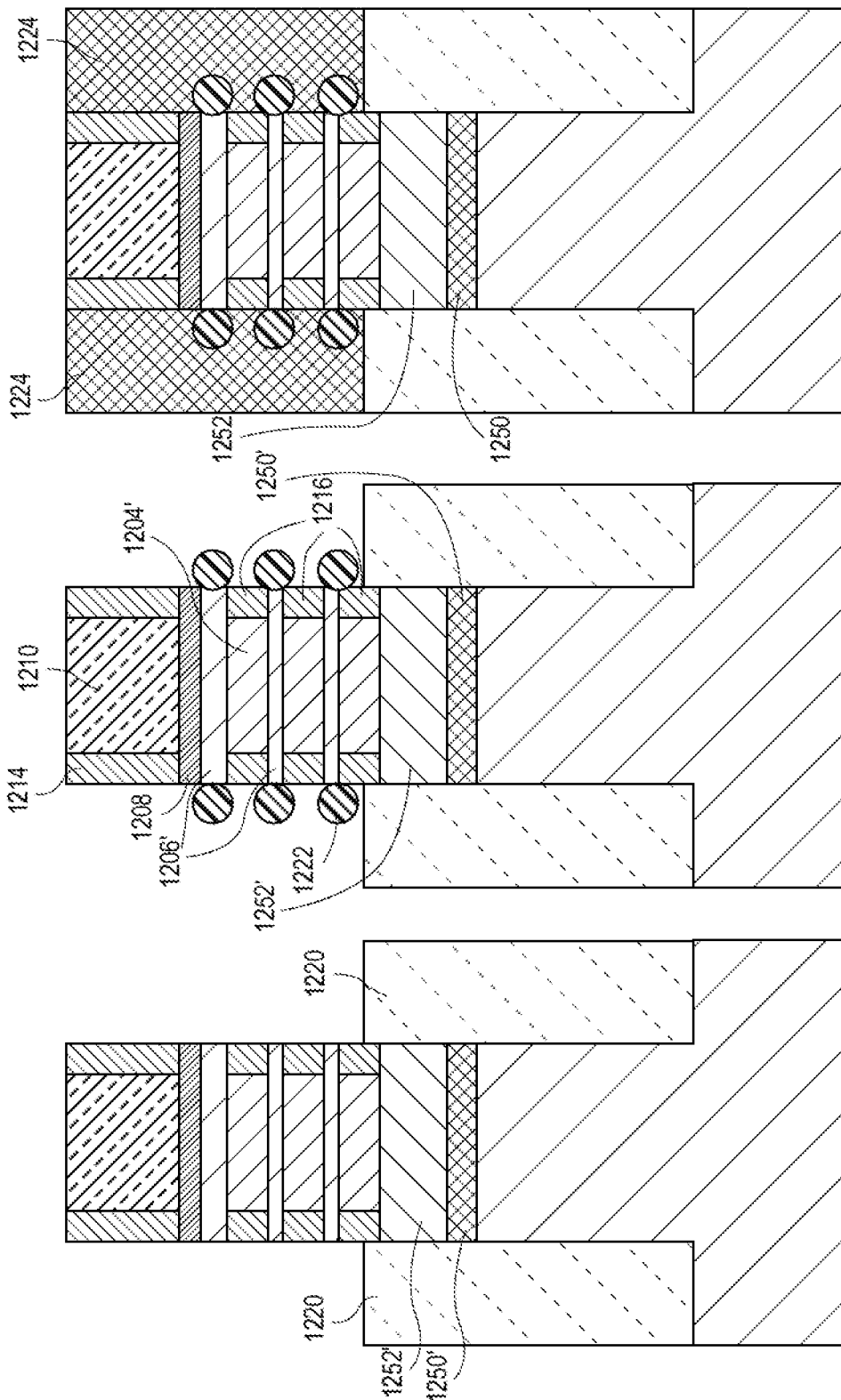

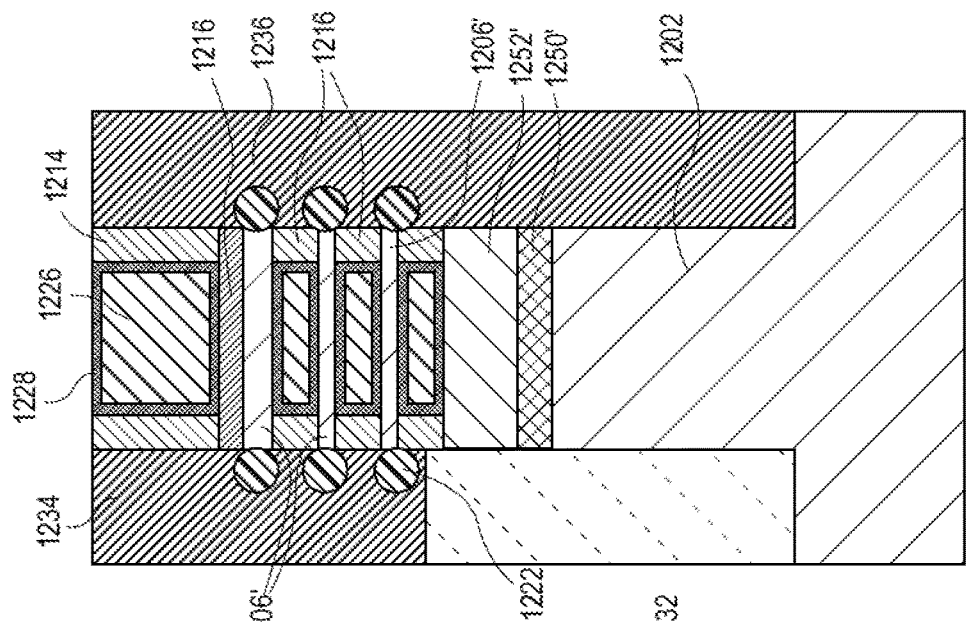
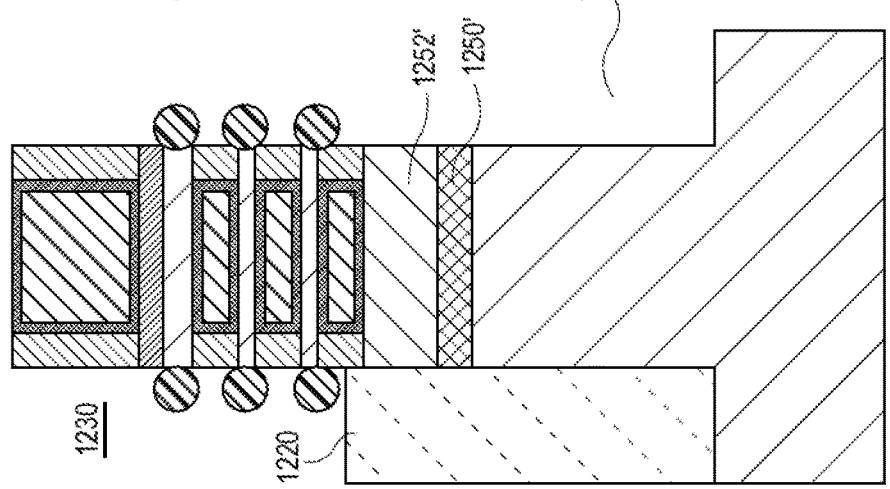
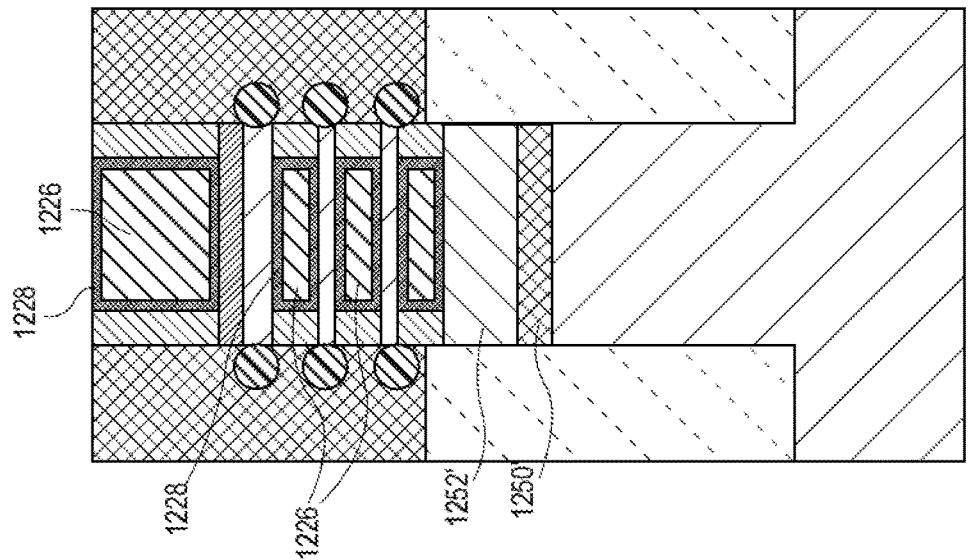
FIG. 12J
FIG. 12I
FIG. 12H

INTEGRATED CIRCUIT STRUCTURE WITH FRONT SIDE SIGNAL LINES AND BACKSIDE POWER DELIVERY

TECHNICAL FIELD

Embodiments of the disclosure are in the field of advanced integrated circuit structure fabrication and, in particular, integrated circuit structures having front side signal lines and backside power delivery.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

Variability in conventional and currently known fabrication processes may limit the possibility to further extend them into the 10 nanometer node or sub-10 nanometer node range. Consequently, fabrication of the functional components needed for future technology nodes may require the introduction of new methodologies or the integration of new technologies in current fabrication processes or in place of current fabrication processes.

In the manufacture of integrated circuit devices, multi-gate transistors, such as tri-gate transistors, have become more prevalent as device dimensions continue to scale down. Tri-gate transistors are generally fabricated on either bulk silicon substrates or silicon-on-insulator substrates. In some instances, bulk silicon substrates are preferred due to their lower cost and compatibility with the existing high-yielding bulk silicon substrate infrastructure.

Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming.

BRIEF DESCRIPTION OF THE DRAWINGS

FIGS. 12A-12J illustrates cross-sectional views of various operations in a method of fabricating a gate-all-around integrated circuit structure, in accordance with an embodiment of the present disclosure.

DESCRIPTION OF THE EMBODIMENTS

Figure 1A:
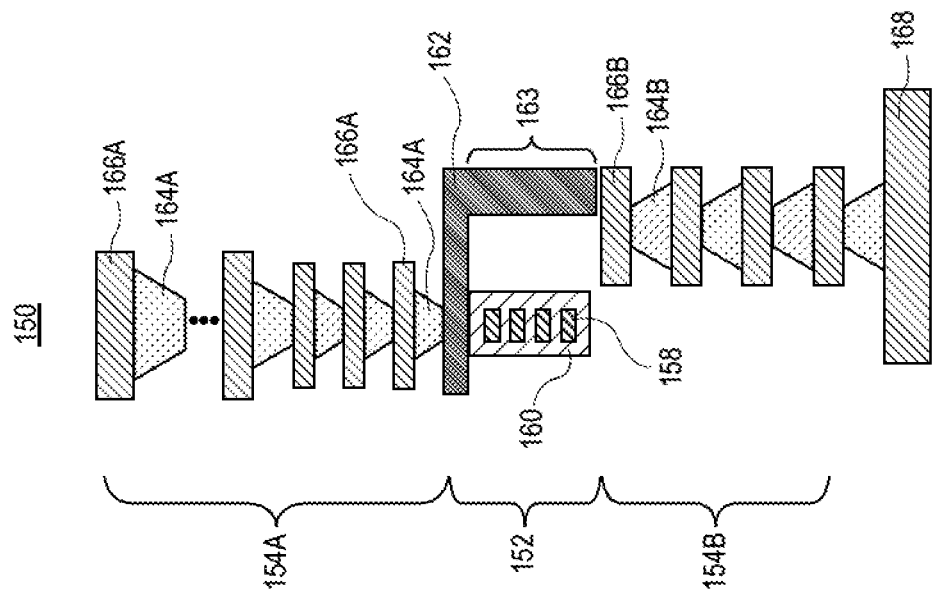
FIG. 1A illustrates cross-sectional views of an interconnect stack having front side power delivery and of an interconnect stack having backside power delivery, in accordance with an embodiment of the present disclosure.
Figure 1A:
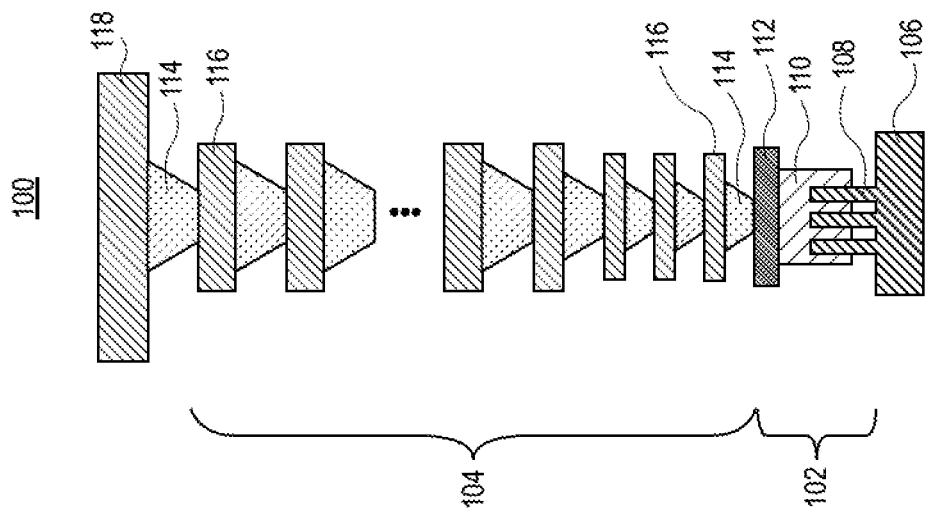

Integrated circuit structures having front side signal lines and backside power delivery are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions or context for terms found in this disclosure (including the appended claims):

"Comprising." This term is open-ended. As used in the appended claims, this term does not foreclose additional structure or operations.

"Configured To." Various units or components may be described or claimed as "configured to" perform a task or tasks. In such contexts, "configured to" is used to connote structure by indicating that the units or components include structure that performs those task or tasks during operation. As such, the unit or component can be said to be configured to perform the task even when the specified unit or component is not currently operational (e.g., is not on or active). Reciting that a unit or circuit or component is "configured to" perform one or more tasks is expressly intended not to invoke 35 U.S.C. § 112, sixth paragraph, for that unit or component.

"First," "Second," etc. As used herein, these terms are used as labels for nouns that they precede, and do not imply any type of ordering (e.g., spatial, temporal, logical, etc.).

"Coupled"—The following description refers to elements or nodes or features being "coupled" together. As used herein, unless expressly stated otherwise, "coupled" means that one element or node or feature is directly or indirectly joined to (or directly or indirectly communicates with) another element or node or feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation or location or both of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, or effect which might otherwise occur. Accordingly, when a component, element, or feature is referred to as inhibiting a result or state, it need not completely prevent or eliminate the result or state.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) get interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to boundary deep via standard cell architectures. One or more embodiments are directed to a four line metal 0 (4 M0) track architecture with backside power delivery. One or more embodiments may be implemented to enable shorter cell heights, achieve minimum area and support process scaling.

In accordance with an embodiment of the present disclosure, an architecture with 4 signal routing M0 tracks is described which supports a minimum area design that is applicable to both FinFET and Gate-All-Around transistors. Libraries in previous technology nodes use 5 or more signal routing M0 tracks within any given cell height in order to reduce standard cell area to minimum area design. An architecture described herein allows node level power/performance/area scaling while keeping the M0/M1/M2 pitches loose.

To provide context, horizontal signal routing tracks can be the most critical factors to achieve minimum standard cell area. Thus, it may be preferable to have more horizontal (metal0, M0) tracks within any given standard cell height from a design perspective to achieve minimum area. This can require tighter M0 pitch for any given cell height which increases process cost, risk and potentially product time-to-market. Thus, from a process development perspective, architectures with less horizontal routing tracks, hence loser M0 pitch, may be preferred. In addition, loser metal pitch can enable a process to better tradeoff interconnect resistance and capacitance, resulting in better performance and/or power reduction.

To provide context, first generation EUV technology use requires a conservative approach to metal patterning. Rather than defining metal pitches that would require pitch halving or Litho-Etch-Litho-Etch approaches, a direct print approach has been deemed to be safer and cost-effective. Earlier technology nodes exercise a tight M0 pitch with fixed width and space. The M0 pitch was relaxed in later technology node high density and high performance libraries. In an embodiment, in order to achieve area scaling in a reverse scaling metal pitch, the metal 0 architecture is updated from greater than or equal to 5 signal tracks to 4 signal tracks with metal width and space flexibility above a minimum pitch.

In comparison to earlier processes process, three items that can enable high routing efficiency while reducing metal track count on the cell level can include (1) M0 stopping point flexibility (e.g., a metal edge can be stopped at poly/gate or trench contact/tcn), (2) M0 minimum length reduced to 1.5×Poly pitch–M0 ETE, and/or (3) a boundary deep via which delivers power from a wafer or substrate backside to eliminate provisions reserved for Power/GND network on the cell design. The above three items can enable equal or better cell routing capability in comparison to earlier architectures with higher track count.

To provide context, a contact-over-active-gate (COAG) feature can be implemented to enable higher routing efficiency than comparable competitor 4 track library architectures on the cell level. Previous 4 track libraries with low routing efficiency of complex circuitry such as pass-gates. This deficiency led to greater track count requirement for comparable sequential cell families. Higher routing efficiency can be achieved with a COAG feature, where the gate connectivity is not limited to 2 center metal tracks away from diffusion. Instead, all signal tracks can be used for gate connectivity independent of proximity to the diffusion with simpler metal 0/metal 1 requirements. In addition, the COAG feature does not require TCN (diffusion contact) to be cut when next to a gate via. Therefore, COAG allows relaxed metal0 and metal1 pitch, or in other words, lower track count to achieve a same or superior routing efficiency.

Traditionally, power is delivered from a front side interconnect. At standard cell level, power can be delivered right on top of transistors or from a top and bottom cell boundary. Power delivered from a top and bottom cell boundary enables relatively shorter standard cell height with slightly higher power network resistance. However, a front side power network shares interconnect stack with signal routing and reduces signal routing tracks. In addition, for high performance design, top and bottom cell boundary power metal wires must be wide enough to reduce power network resistance and improve performance. This normally results in a cell height increase. In accordance with one or more embodiments of the present disclosure, delivering power from a wafer or substrate backside can be implemented to solve area and performance problems. At the cell level, wider metal 0 power at the top and bottom cell boundary may no longer be needed and, hence, cell height can be reduced. In addition, power network resistance can be significantly reduced resulting in performance improvement. At block and chip level, front side signal routing tracks are increased due to removed power routing and power network resistance is significantly reduced due to very wide wires, large vias and reduced interconnect layers.

In earlier technologies, a power delivery network from bump to the transistor required significant block resources. Such resource usage on the metal stack expressed itself in some process nodes as Standard Cell architectures with layout versioning or cell placement restrictions in the block level. In an embodiment, eliminating the power delivery network from the front side metal stack allows free sliding cell placement in the block without power delivery complications and placement related delay timing variation.

As a comparison, FIG. 1A illustrates cross-sectional views of an interconnect stack having front side power delivery and of an interconnect stack having backside power delivery, in accordance with an embodiment of the present disclosure.

Referring to FIG. 1A, an interconnect stack 100 having front side power delivery includes a transistor 102 and signal and power delivery metallization 104. The transistor 102 includes a bulk substrate 106, semiconductor fins 108, a terminal 110, and a device contact 112. The signal and power delivery metallization 104 includes conductive vias 114, conductive lines 116, and a metal bump 118.

Referring again to FIG. 1A, an interconnect stack 150 having backside power delivery includes a transistor 152, front side signal metallization 154A, and power delivery metallization 154B. The transistor 152 includes semiconductor nanowires or nanoribbons 158, a terminal 160, and a device contact 162, and a boundary deep via 163. The front side signal metallization 154A includes conductive vias 164A and conductive lines 166A. The power delivery metallization 154B includes conductive vias 164B, conductive lines 166B, and a metal bump 168.

Figure 1B:
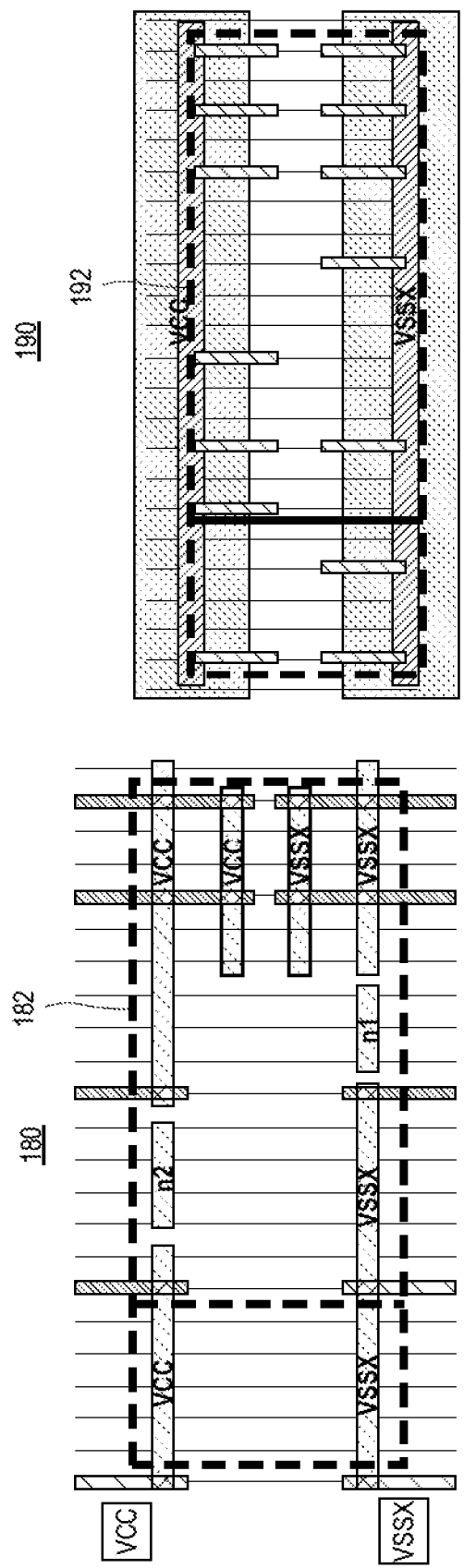
FIG. 1B illustrates schematic plan views of a standard cell having front side power delivery and of a standard cell having backside power delivery, in accordance with an embodiment of the present disclosure.

As a comparison, FIG. 1B illustrates schematic plan views 180 and 190 of a standard cell 182 having front side power delivery (e.g., based on an interconnect stack such as interconnect stack 100) and of a standard cell 192 having backside power delivery (e.g., based on an interconnect stack such as interconnect stack 150), respectively, in accordance with an embodiment of the present disclosure.

In accordance with an embodiment of the present disclosure, a 4 M0 signal routing track architecture is combined with top and bottom cell boundary power supply delivered from backside. As an example, FIG. 2 illustrates schematic plan views of various layouts of a standard cell architecture having a deep via boundary (DVB) power at a top and bottom cell boundary, in accordance with an embodiment of the present disclosure.

Figure 2:
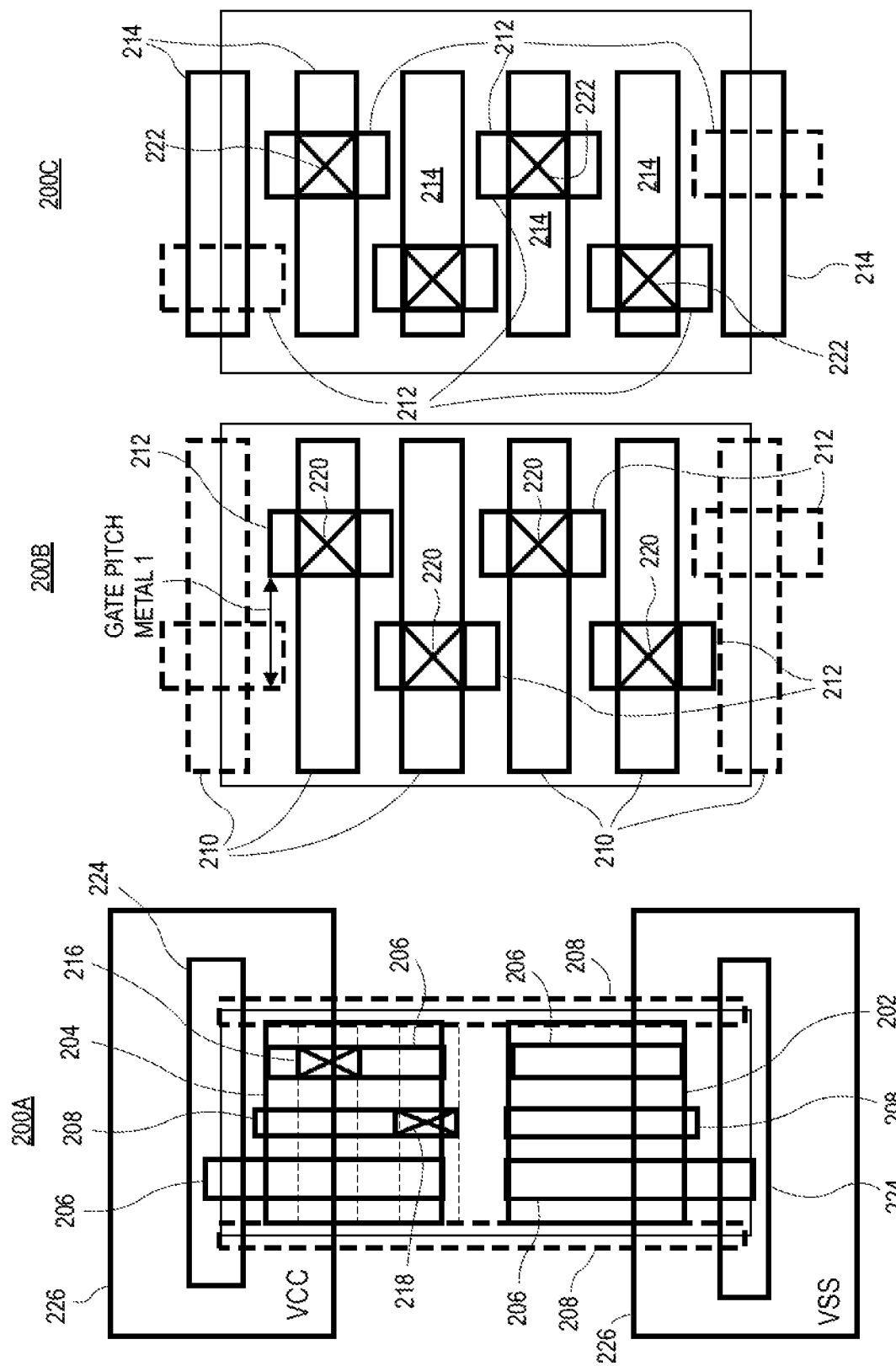
FIG. 2 illustrates schematic plan views of various layouts of a standard cell architecture having a deep via boundary (DVB) power at a top and bottom cell boundary, in accordance with an embodiment of the present disclosure.

Referring to FIG. 2, a gate level layout 200A includes N diffusion 202, P diffusion 204, trench contact 206, poly/gate 208, gate via 218, backside via 224 (deep via boundary, or through-silicon via), and backside metal 0 (226). A metal 1 layout 200B includes metal 0 lines 210, metal 1 lines 212, and via 0 (220). A metal 2 layout 200C includes metal 1 lines 212, metal 2 lines 214, and via 1 (222).

With reference again to FIG. 2, in an embodiment, the architecture and corresponding design rules enable minimum standard cell area design with very low power network resistance under any given cell height and transistor gate pitch. This can result in minimum area, lower power and higher performance standard cell libraries. In addition, a power delivery network is removed from front side interconnect stack resulting in more signal routing tracks and hence block/chip area reduction even with same standard cell area. In a particular embodiment, a standard cell architecture features 4 horizontal m0 signal routing tracks with the capability to stop at poly edge and TCN edge at 1.5*Gate pitch equivalent m0 plug minimum pitch. Power is delivered from the wafer backside, eliminating the need for power network delivery resources on the cell level from front-side metal stack. Gate to metal 1 ratio of 1:1 is used with minimum length of 2*M0 pitches–M1 ETE. Benefits of implementing a standard cell such as described herein include one or more of minimum cell area, higher performance, low power and ease of use library, improved pin hit-points and more routing resources for chip design, low process cost, risk, and simpler process flow and faster time-to-market.

Figure 3A:
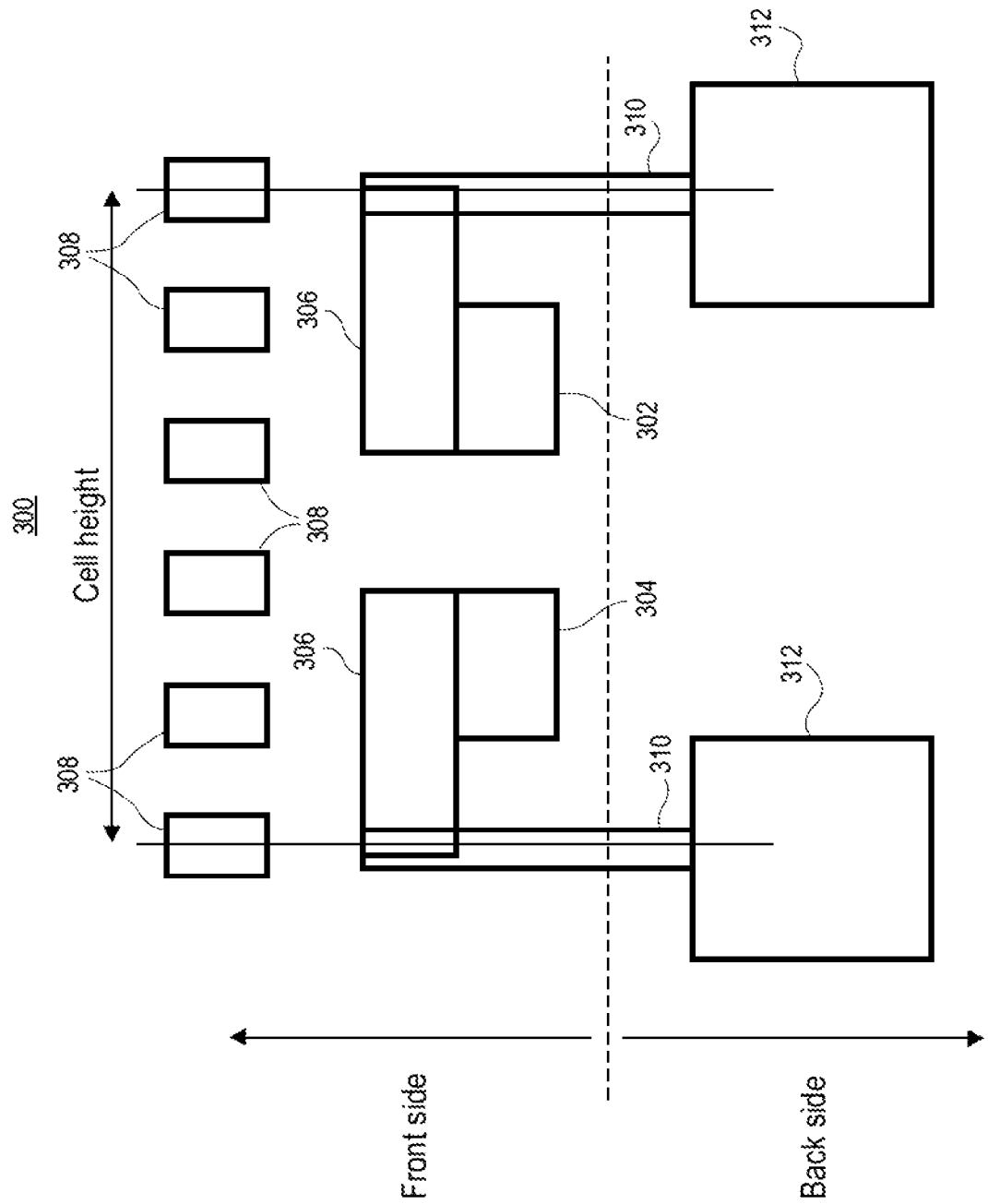
FIG. 3A is a schematic illustrating a cross-section of a standard cell with 4 M0 signal routing tracks inside cell and backside power delivery to top and bottom cell boundary through DVB (through-silicon-via), in accordance with an embodiment of the present disclosure.

FIG. 3A is a schematic illustrating a cross-section of a standard cell with 4 M0 signal routing tracks inside cell and backside power delivery to top and bottom cell boundary through DVB (through-silicon-via), in accordance with an embodiment of the present disclosure.

Referring to FIG. 3A, an integrated circuit structure 300 includes N diffusion 302, P diffusion 304, trench contacts 306, metal 0 lines 308, backside via 310 (deep via boundary, or through-silicon via), and backside metal 0 (312). The integrated circuit structure 300 includes 4 signal metal0 routing tracks within cell height with ETE centered on poly or TCN track and minimum pitch of 1.5 PP (poly pitch), power delivered from backside from top and bottom cell boundary with through-silicon-via (DVB), gate pitch metal 1 (metal 1 having gate pitch), a COAG feature to allow gate connection made from any signal metal 0 track, and left and right cell boundary centered on poly track.

With reference again to FIG. 3A, an integrated circuit structure includes a plurality of gate lines extending over a plurality of semiconductor nanowire stack channel structures or semiconductor fin channel structures within a cell boundary, the plurality of gate lines having a pitch. A plurality of trench contacts is extending over a plurality of source or drain structures within the cell boundary, individual ones of the plurality of trench contacts alternating with individual ones of the plurality of gate lines. A first signal line, a second signal line, a third signal line, and a fourth signal line are over the plurality of gate lines and the plurality of trench contacts within the cell boundary, the first, second, third and fourth signal lines having a minimum pitch of 1.5 times the pitch.

In one embodiment, a backside power delivery line is beneath the plurality of semiconductor nanowire stack channel structures or semiconductor fin channel structures and the plurality of source or drain structures, the backside power delivery line coupled to one of the plurality of trench contacts within the cell boundary. In a specific such embodiment, the backside power delivery line is coupled to the one or more of the plurality of trench contacts by a through-silicon via.

In one embodiment, one of the first, second, third and fourth signal lines is coupled to one of the plurality of gate lines over one of the plurality of semiconductor nanowire stack channel structures or semiconductor fin channel structures from a plan view perspective. In one embodiment, the integrated circuit structure further includes a plurality of conductive lines above the first, second, third and fourth signal lines within the cell boundary. In one such embodiment, the plurality of conductive lines having the pitch.

In one embodiment, an end-to-end (ETE) of the cell boundary is centered on the plurality of gate lines. In another embodiment, an end-to-end (ETE) of the cell boundary is centered on the plurality of trench contacts.

Figure 3B:
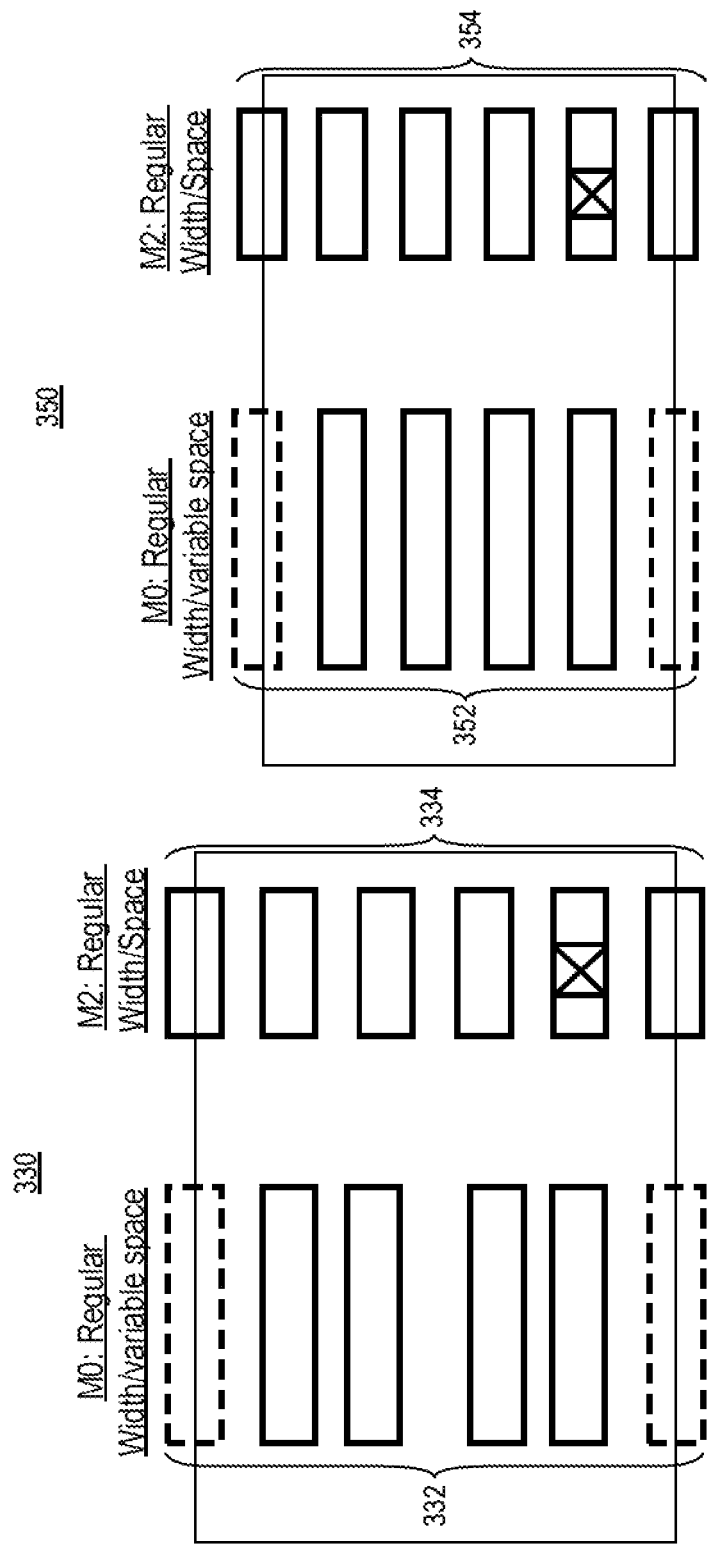
FIG. 3B illustrates schematic plan views of options for M0 and M2 tracks, in accordance with an embodiment of the present disclosure.

FIG. 3B illustrates schematic plan views of options for M0 and M2 tracks, in accordance with an embodiment of the present disclosure. Referring to FIG. 3B, a layout 330 includes metal 0 lines 332 and metal 2 lines 334. The metal 0 lines 332 have regular width and variable space. The metal 2 lines 334 have regular width and regular space. A layout 350 includes metal 0 lines 352 and metal 2 lines 354. The metal 0 lines 342 have regular width and regular space. The metal 2 lines 354 have regular width and regular space.

In an embodiment, a boundary deep via in a Standard Cell can be detected by one or more of the following features: (1) In an IP block, there will be no power/ground delivery network that is delivered from the Front-End bump. Instead, the power to the standard cells are distributed through a via on the top and bottom cell border that connects to a wafer backside metal network. This is accomplished by extending the diffusion contact (TCN) to touch to the boundary via; (2) typically, the power/gnd network can be observed on the top/bottom cell boundary m0 and m2 tracks in earlier architectures. On the other hand, the m0/m2 on the cell boundary will not carry power/gnd net for majority of the cells, other than signal shielding purposes. More often than not, if it is used it will be for block level signal routing; (3) The Deep Boundary Via can be and will be used in both different processes. One such process can be based on FinFET devices, while another process can be based Gate All Around (e.g., nanowire or nanoribbon) devices; (4) Architectures use a M0 pattern where there is an m0 track aligned to the cell boundary primarily meant for block level routing and 4 M0 tracks that are inside the cell and meant to be used for signal routing. Active metal0—with vias—of length as short as (1.5*poly pitch)−(Metal0 end-to-end) with ability to align plug centers to both poly and TCN tracks is a hallmark of the architecture. This feature allows these architectures the ability to route complex structures such as pass-gate structures in single height cells in as small as 2 poly pitches using only 4 M0 signal tracks contained within a single cell height. However, this architecture is not limited to 4 M0 signal tracks only within the cell and a M0 track centered on top/bottom cell boundary. Cells can be designed to be taller or the backend stack can be tightened to enable 5 or more M0 signal tracks contained in a single height; (5) Architectures have 1:1 gear ratio between metal 1 and gate(poly) pitch. The active Metal1 length with vias can be as short as (2*M0 pitches)−(M1 End to End). This feature allows high routability in the block level while using 1:1 gear ratio between metal 1 and gate(poly) pitch. On the other hand, 3:2 gear ratio between Metal1 and gate(poly) pitch which produces higher number M1 tracks for a given number of poly tracks is common to see in earlier technologies. The architecture is not only limited to 1:1 gear ratio. It can be made compatible with 3:2 gear ratio or higher gear ratios.

In an embodiment, a standard cell architecture features 4 signal metal 0 routing tracks which can stop at poly or TCN tracks with top and bottom cell boundary power TSV connecting to TCN and backside metal. The extra M0 tracks on top and bottom cell boundary are not used by standard cell design and can be used as routing tracks at block and chip level design. In an embodiment, an architecture has 4 metal 0 tracks with capability of stopping at poly and TCN within cell height for signal routing. Top and bottom cell boundary DVBs connect to TCN and BM0 to deliver power. Left and right cell boundary are centered on a poly track. The gate pitch is used as the metal 1 pitch. COAG feature allows gate connection made from any signal metal 0 track.

Figure 4:
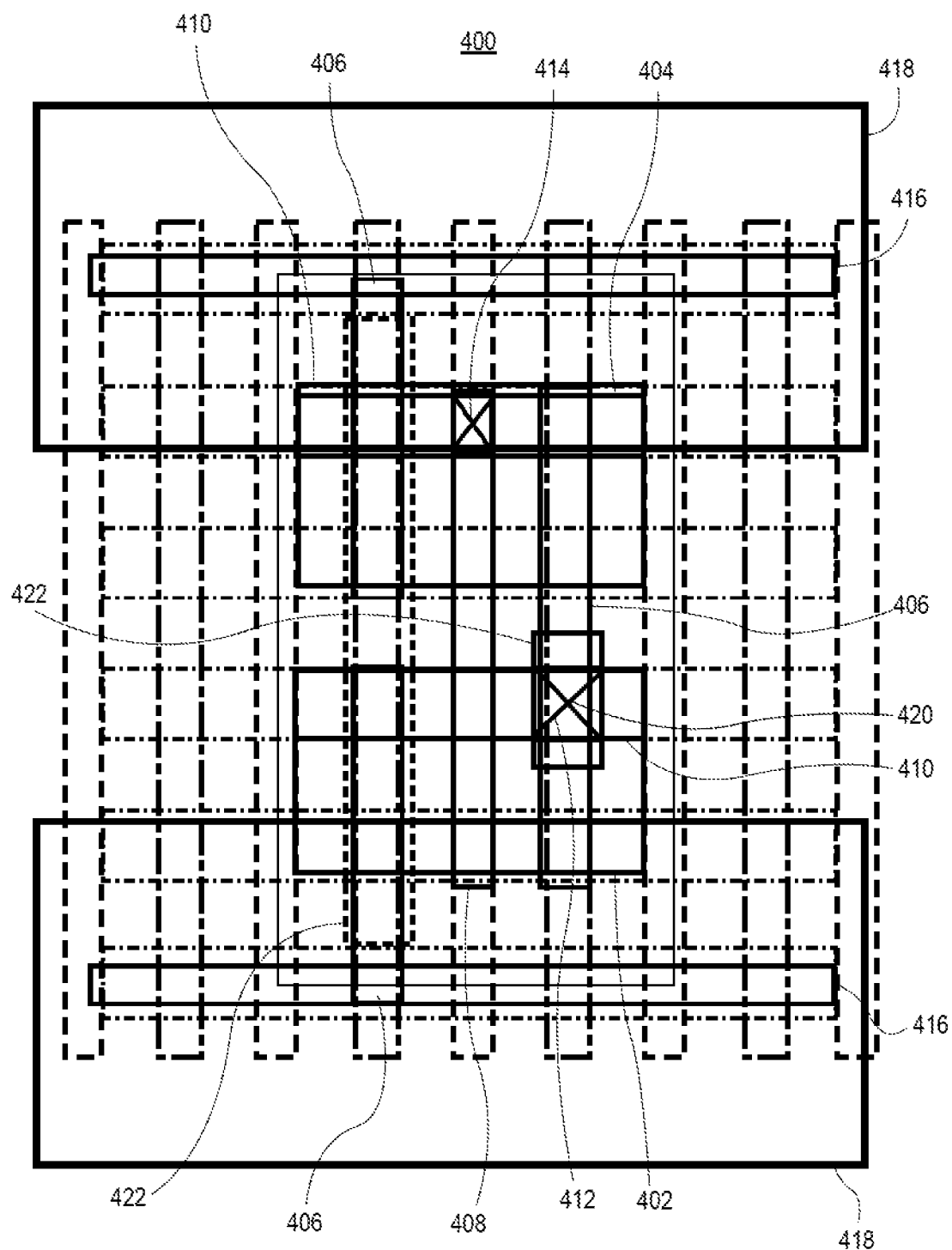
FIG. 4 illustrates a schematic plan view of an inverter, in accordance with an embodiment of the present disclosure.

FIG. 4 illustrates a schematic plan view of an inverter, in accordance with an embodiment of the present disclosure. Referring to FIG. 4, a layout 400 includes N diffusion 402, P diffusion 404, trench contact 406, poly/gate 408, metal 0 lines 410, trench via 412, gate via 414, backside via 416 (deep via boundary, or through-silicon via), backside metal 0 (418), via 0 (420), and metal 1 lines 422. In one embodiment, DVB is a large through silicon via (TSV) aligned to the top and bottom cell boundary. When TCN overlaps with DVB, they are connected. Signal TCN and poly are spaced apart from DVB. A wide backside BM0 layer direction lands on DVB to provide power delivery. The fundamental device can be based on a fin or a ribbon.

In an embodiment, metal 0 at top and bottom cell boundary are not used by cell design and can be used by block level design as a routing layer. However, in double and multiple cell height, metal 0 at multiple single cell height location can be used by cell level design if they are not at top and bottom cell boundary. With only 4 metal 0 for signal routing, it can be very challenging to design cells which require more than 4 horizontal routing tracks. Libraries in previous generations supported up to 7 metal 0 tracks. The following section describes how to design cells which require more than 4 metal 0 tracks, most commonly are pass-gate MUX structures. Generally, metal 2 tracks have to be used. However, cells with these structures are generally low pin density cells. Some metal 2 usage generally does not impact block level routing which has been shown by many routed blocks.

Figure 5:
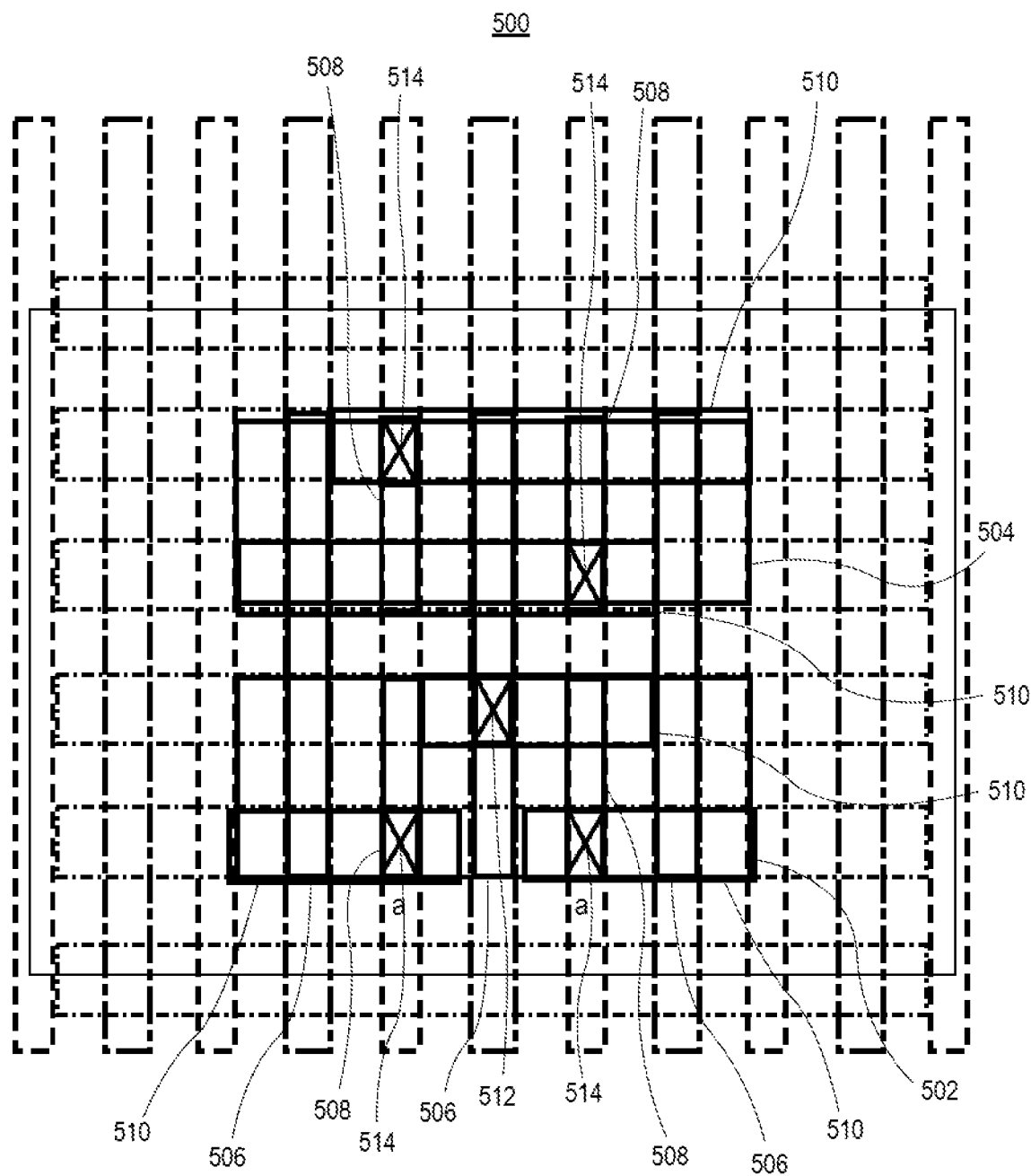
FIG. 5 illustrates a schematic plan view of a passgate MUX structure, in accordance with an embodiment of the present disclosure.

FIG. 5 illustrates a schematic plan view of a passgate MUX structure, in accordance with an embodiment of the present disclosure. Referring to FIG. 5, a layout 500 includes N diffusion 502, P diffusion 504, trench contact 506, poly/gate 508, metal 0 lines 510, trench via 512, and gate via 514. M0 can stop at both poly and TCN tracks. This allows same metal 0 track sharing to land the required gate and diffusion contacts.

Figure 6:
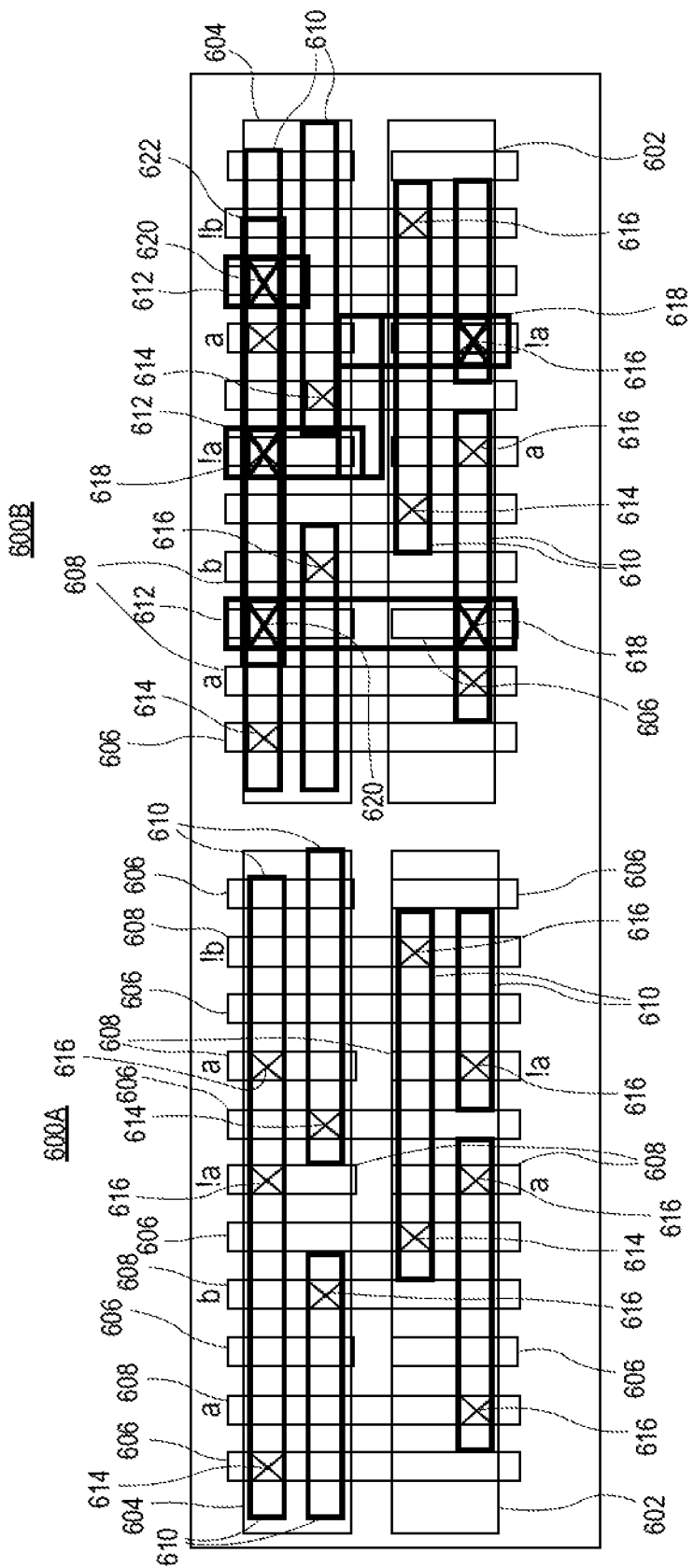
FIG. 6 illustrates a schematic plan view of a 4 M0 implementation of structure with 1 metal 2 usage, in accordance with an embodiment of the present disclosure.

FIG. 6 illustrates a schematic plan view of a 4 M0 implementation of a structure with 1 metal 2 usage, such as an XOR structure, in accordance with an embodiment of the present disclosure. Referring to FIG. 6, layouts 600A and 600B collectively include N diffusion 602, P diffusion 604, trench contact 606, poly/gate 608, metal 0 lines 610, metal 1 lines 612, trench via 614, gate via 616, via 0 (618), via 1 (620), and metal 2 lines 622. With support of bi-directional metal 1 (a benefit of relaxed pitch metal 1 which is supported by direct print EUV), the structure is designed with 1 metal 2 usage. However, this solution had its own set of design rule requirements. Most of them are attainable without any impact and supported in previous generations except the backside power delivery.

Figure 7:
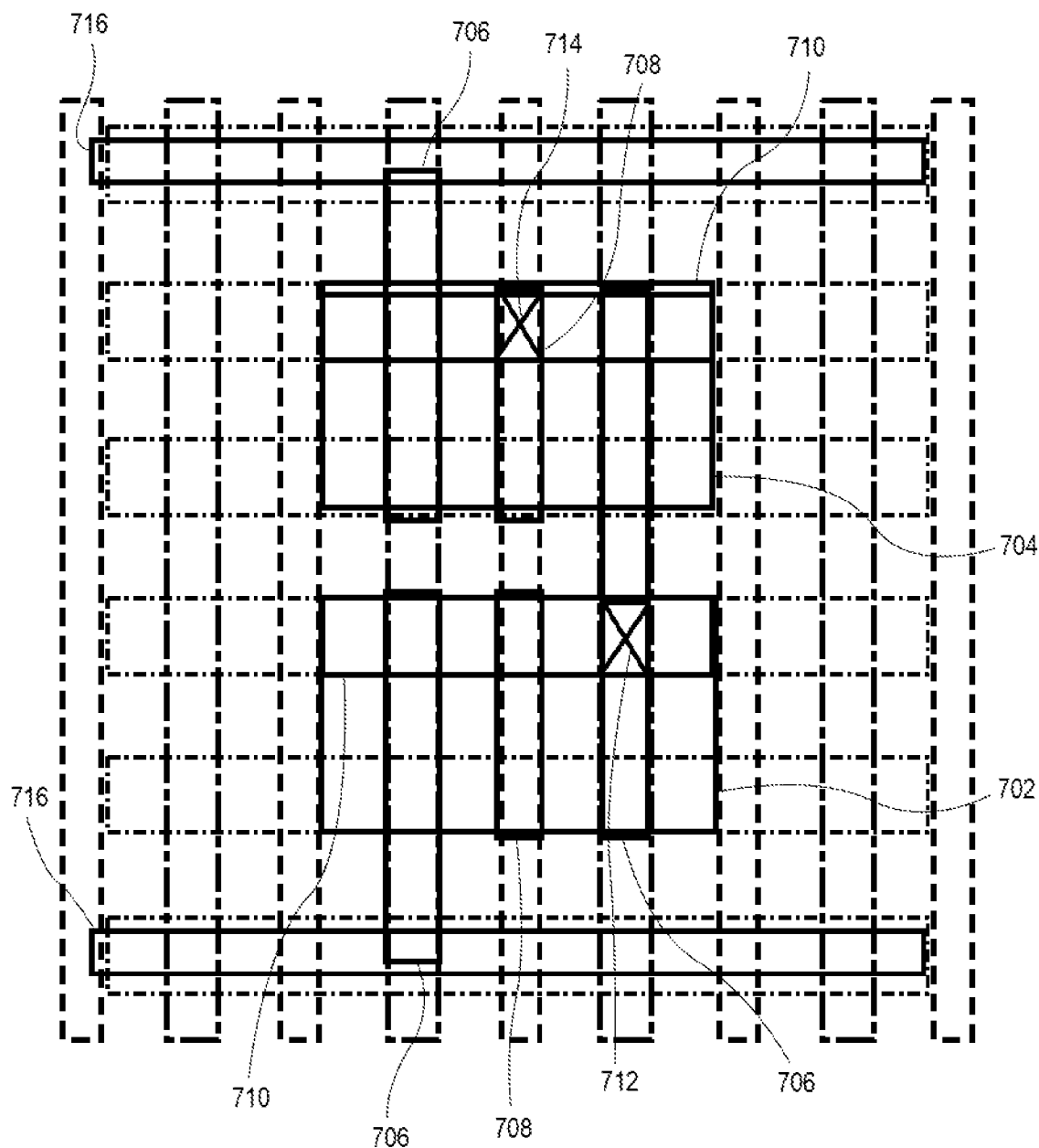
FIG. 7 illustrates a schematic plan view of a COAG feature illustration, in accordance with an embodiment of the present disclosure.

In an embodiment, in order to achieve minimum cell area, gate contacts are placed under all 4 signal metal tracks. This allows direct diffusion to gate connection without the need to switch metal tracks. The required process feature is Contact Over Active Gate (COAG). FIG. 7 illustrates a schematic plan view of a COAG feature illustration, in accordance with an embodiment of the present disclosure. Referring to FIG. 7, a layout includes N diffusion 702, P diffusion 704, trench contact 706, poly/gate 708, metal 0 lines 710, trench via 712, gate via 714, and backside via 716 (deep via boundary, or through-silicon via).

Figure 8:
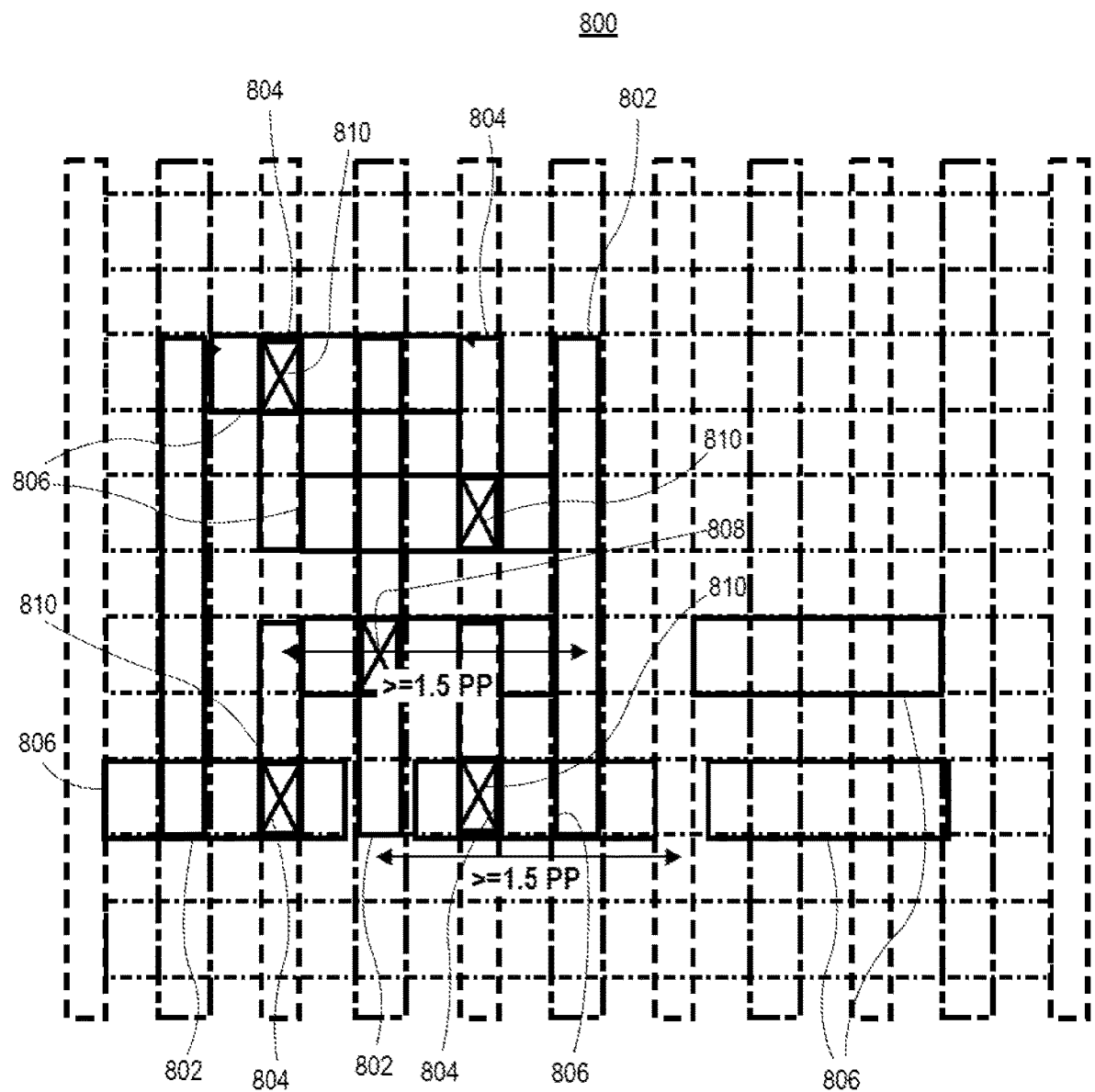
FIG. 8 illustrates a schematic plan view of m0 stops and poly and TCN track and 1.5 PP min ETE pitch, in accordance with an embodiment of the present disclosure.

In an embodiment, to place gate and diffusion contacts under a compact passgate MUX structure under 4 M0 track architecture, metal 0 tracks are shared as described above in association with FIG. 5. This may require metal 0 to be broken at poly or TCN tracks. FIG. 8 illustrates a schematic plan view of m0 stops and poly and TCN track and 1.5 PP min ETE pitch, in accordance with an embodiment of the present disclosure. Referring to FIG. 8, a layout 800 includes trench contact 802, poly/gate 804, metal 0 lines 806, trench via 808, and gate via 810.

With reference again to FIG. 8, in an embodiment, to achieve minimum cell area and at the same time to reduce parasitic to improve performance and reduce power, shorter metal 0 is preferred. Previous generations support minimum 2 PP M0 ETE pitch, 1 PP pitch was only supported on dummy/fill metal0s. In one embodiment, an architecture described herein requires 1.5 PP min metal ETE pitch.

Figure 9:
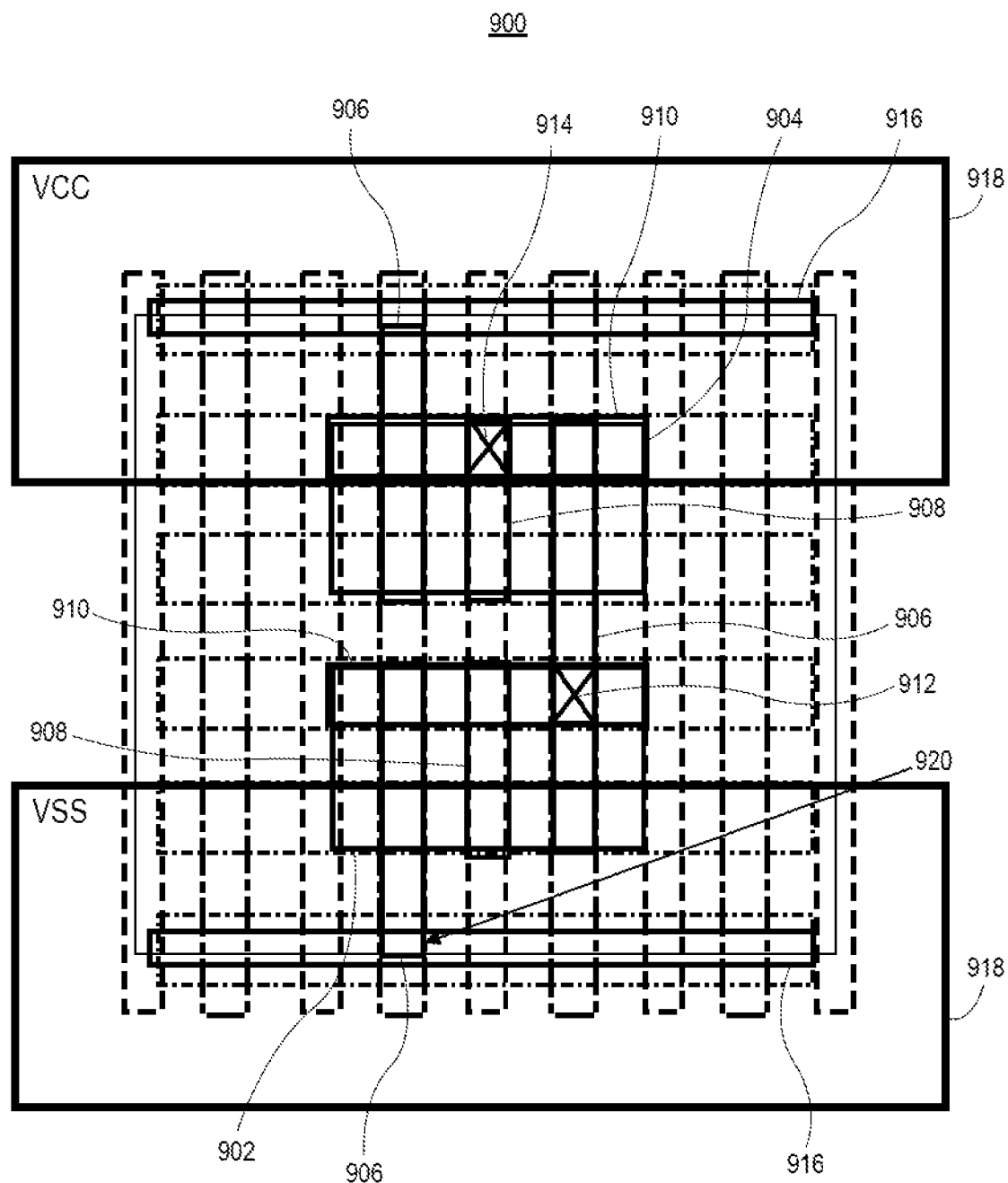
FIG. 9 illustrates a schematic plan view of power delivered to cell through DVB (through-silicon-via) at the top and bottom cell boundary, in accordance with an embodiment of the present disclosure.

In an embodiment, 4 metal 0 tracks are dedicated for signal routing. Power is delivered either with additional metal 0 tracks from front side or backside interconnect stack. Backside power delivery provides significant area and performance benefits at the block level for high performance designs in addition to cell height reduction. DVB is a through silicon via layer which is located at top and bottom cell boundary and connects to TCN and BM0 to delivery power to standard cell. FIG. 9 illustrates a schematic plan view of power delivered to cell through DVB (through-silicon-via) at the top and bottom cell boundary, in accordance with an embodiment of the present disclosure. Referring to FIG. 9, a layout 900 includes N diffusion 902, P diffusion 904, trench contact 906, poly/gate 908, metal 0 lines 910, trench via 912, gate via 914, backside via 916 (deep via boundary, or through-silicon via), and backside metal 0 (918). The backside via 916 connects to trench contact 906 and backside metal 0 (918), e.g., at location 920.

In an embodiment, with the above design rule support, generally all standard cells in high performance and high density libraries can be designed in theoretical minimum poly pitches with minimum metal 2 usage.

In another aspect, contact over active gate (COAG) structures and processes are described. One or more embodiments of the present disclosure are directed to semiconductor structures or devices having one or more gate contact structures (e.g., as gate contact vias) disposed over active portions of gate electrodes of the semiconductor structures or devices. One or more embodiments of the present disclosure are directed to methods of fabricating semiconductor structures or devices having one or more gate contact structures formed over active portions of gate electrodes of the semiconductor structures or devices. Approaches described herein may be used to reduce a standard cell area by enabling gate contact formation over active gate regions. In accordance with one or more embodiments, tapered gate and trench contacts are implemented to enable COAG fabrication. Embodiments may be implemented to enable patterning at tight pitches.

To provide further background for the importance of a COAG processing scheme, in technologies where space and layout constraints are somewhat relaxed compared with current generation space and layout constraints, a contact to gate structure may be fabricated by making contact to a portion of the gate electrode disposed over an isolation region. As an example, FIG. 10A illustrates a plan view of a semiconductor device having a gate contact disposed over an inactive portion of a gate electrode.

Figure 10A:
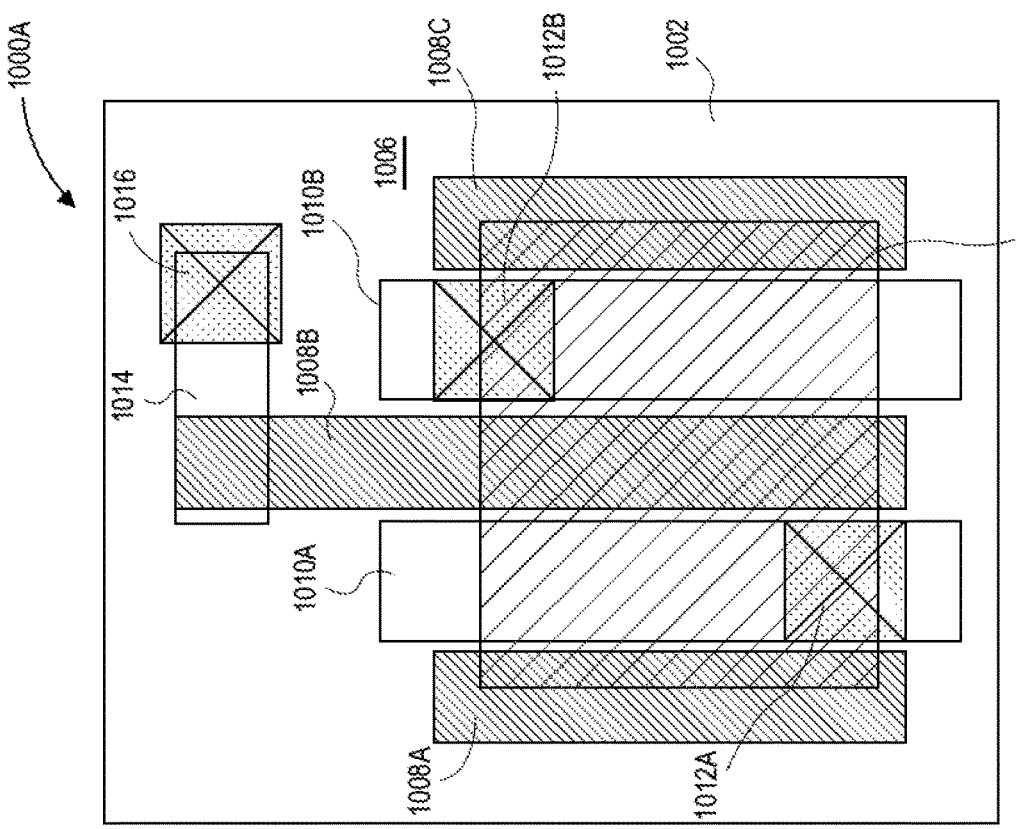
FIG. 10A illustrates a plan view of a semiconductor device having a gate contact disposed over an inactive portion of a gate electrode.

Referring to FIG. 10A, a semiconductor structure or device 1000A includes a diffusion or active region 1004 disposed in a substrate 1002, and within an isolation region 1006. One or more gate lines (also known as poly lines), such as gate lines 1008A, 1008B and 1008C are disposed over the diffusion or active region 1004 as well as over a portion of the isolation region 1006. Source or drain contacts (also known as trench contacts), such as contacts 1010A and 1010B, are disposed over source and drain regions of the semiconductor structure or device 1000A. Trench contact vias 1012A and 1012B provide contact to trench contacts 1010A and 1010B, respectively. A separate gate contact 1014, and overlying gate contact via 1016, provides contact to gate line 1008B. In contrast to the source or drain trench contacts 1010A or 1010B, the gate contact 1014 is disposed, from a plan view perspective, over isolation region 1006, but not over diffusion or active region 1004. Furthermore, neither the gate contact 1014 nor gate contact via 1016 is disposed between the source or drain trench contacts 1010A and 1010B.

Figure 11A:
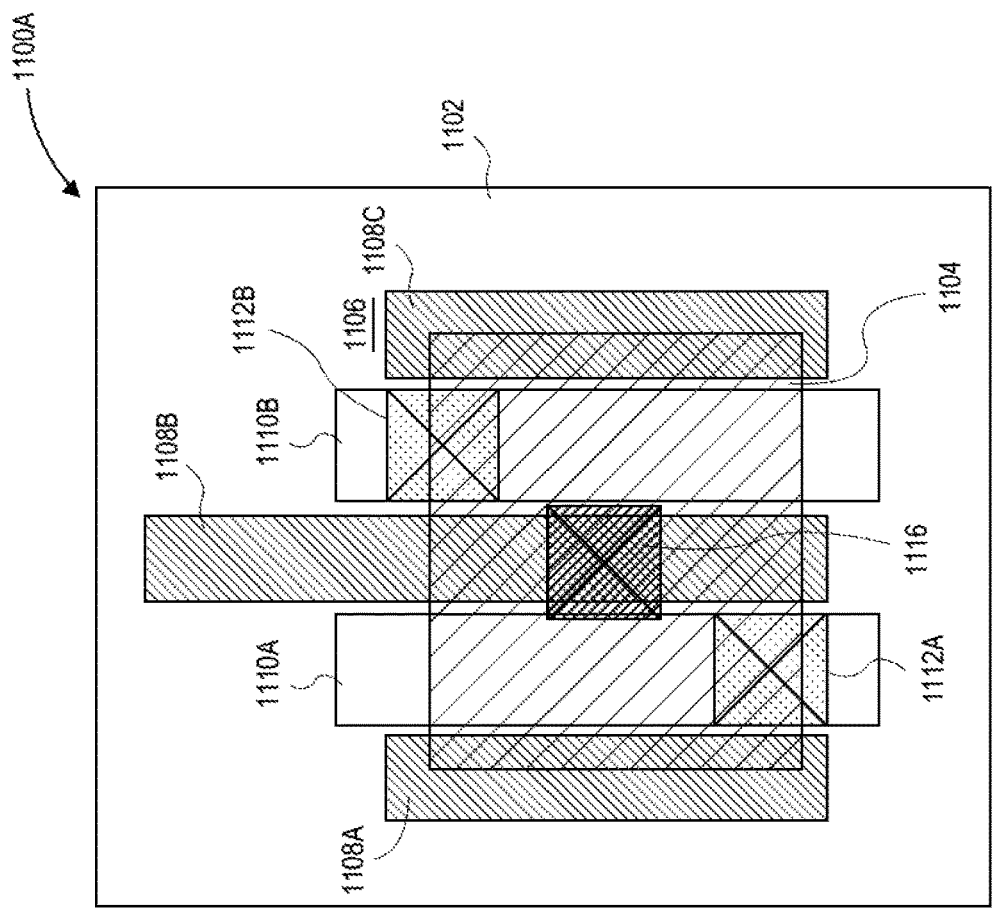
FIG. 11A illustrates a plan view of a semiconductor device having a gate contact via disposed over an active portion of a gate electrode, in accordance with an embodiment of the present disclosure.
Figures 10B, 11B:
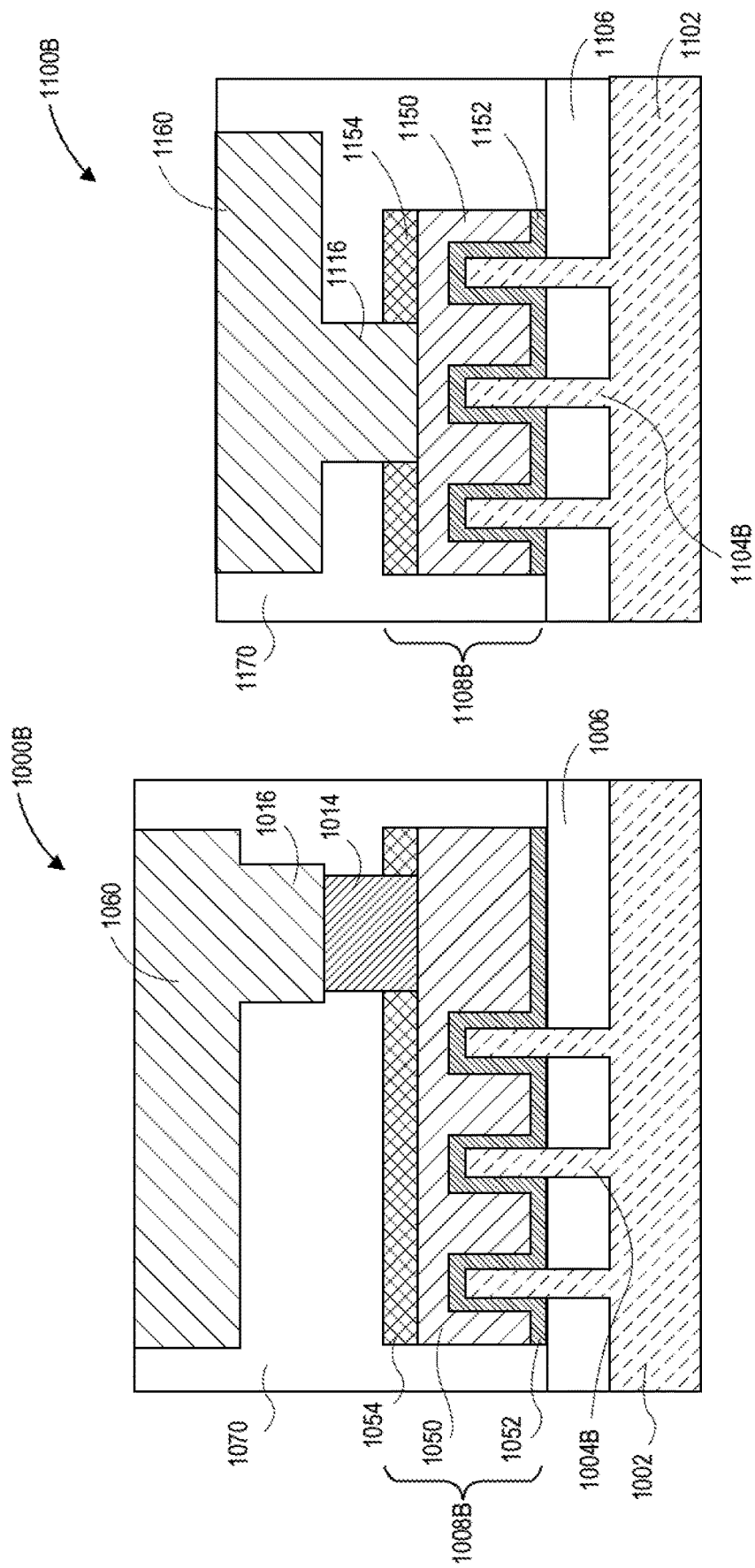
FIG. 10B illustrates a cross-sectional view of a non-planar semiconductor device having a gate contact disposed over an inactive portion of a gate electrode.
FIG. 11B illustrates a cross-sectional view of a non-planar semiconductor device having a gate contact via disposed over an active portion of a gate electrode, in accordance with an embodiment of the present disclosure.

FIG. 10B illustrates a cross-sectional view of a non-planar semiconductor device having a gate contact disposed over an inactive portion of a gate electrode. Referring to FIG. 10B, a semiconductor structure or device 1000B, e.g. a non-planar version of device 1000A of FIG. 10A, includes a non-planar diffusion or active region 1004B (e.g., a fin structure) formed from substrate 1002, and within isolation region 1006. Gate line 1008B is disposed over the non-planar diffusion or active region 1004B as well as over a portion of the isolation region 1006. As shown, gate line 1008B includes a gate electrode 1050 and gate dielectric layer 1052, along with a dielectric cap layer 1054. Gate contact 1014, and overlying gate contact via 1016 are also seen from this perspective, along with an overlying metal interconnect 1060, all of which are disposed in inter-layer dielectric stacks or layers 1070. Also seen from the perspective of FIG. 10B, the gate contact 1014 is disposed over isolation region 1006, but not over non-planar diffusion or active region 1004B.

Referring again to FIGS. 10A and 10B, the arrangement of semiconductor structure or device 1000A and 1000B, respectively, places the gate contact over isolation regions. Such an arrangement wastes layout space. However, placing the gate contact over active regions would require either an extremely tight registration budget or gate dimensions would have to increase to provide enough space to land the gate contact. Furthermore, historically, contact to gate over diffusion regions has been avoided for risk of drilling through other gate material (e.g., polysilicon) and contacting the underlying active region. One or more embodiments described herein address the above issues by providing feasible approaches, and the resulting structures, to fabricating contact structures that contact portions of a gate electrode formed over a diffusion or active region.

As an example, FIG. 11A illustrates a plan view of a semiconductor device having a gate contact via disposed over an active portion of a gate electrode, in accordance with an embodiment of the present disclosure. Referring to FIG. 11A, a semiconductor structure or device 1100A includes a diffusion or active region 1104 disposed in a substrate 1102, and within an isolation region 1106. One or more gate lines, such as gate lines 1108A, 1108B and 1108C are disposed over the diffusion or active region 1104 as well as over a portion of the isolation region 1106. Source or drain trench contacts, such as trench contacts 1110A and 1110B, are disposed over source and drain regions of the semiconductor structure or device 1100A. Trench contact vias 1112A and 1112B provide contact to trench contacts 1110A and 1110B, respectively. A gate contact via 1116, with no intervening separate gate contact layer, provides contact to gate line 1108B. In contrast to FIG. 10A, the gate contact 1116 is disposed, from a plan view perspective, over the diffusion or active region 1104 and between the source or drain contacts 1110A and 1110B.

FIG. 11B illustrates a cross-sectional view of a non-planar semiconductor device having a gate contact via disposed over an active portion of a gate electrode, in accordance with an embodiment of the present disclosure. Referring to FIG. 11B, a semiconductor structure or device 1100B, e.g. a non-planar version of device 1100A of FIG. 11A, includes a non-planar diffusion or active region 1104B (e.g., a fin structure) formed from substrate 1102, and within isolation region 1106. Gate line 1108B is disposed over the non-planar diffusion or active region 1104B as well as over a portion of the isolation region 1106. As shown, gate line 1108B includes a gate electrode 1150 and gate dielectric layer 1152, along with a dielectric cap layer 1154. The gate contact via 1116 is also seen from this perspective, along with an overlying metal interconnect 1160, both of which are disposed in inter-layer dielectric stacks or layers 1170. Also seen from the perspective of FIG. 11B, the gate contact via 1116 is disposed over non-planar diffusion or active region 1104B.

Thus, referring again to FIGS. 11A and 11B, in an embodiment, trench contact vias 1112A, 1112B and gate contact via 1116 are formed in a same layer and are essentially co-planar. In comparison to FIGS. 10A and 10B, the contact to the gate line would otherwise include and additional gate contact layer, e.g., which could be run perpendicular to the corresponding gate line. In the structure (s) described in association with FIGS. 11A and 11B, however, the fabrication of structures 1100A and 1100B, respectively, enables the landing of a contact directly from a metal interconnect layer on an active gate portion without shorting to adjacent source drain regions. In an embodiment, such an arrangement provides a large area reduction in circuit layout by eliminating the need to extend transistor gates on isolation to form a reliable contact. As used throughout, in an embodiment, reference to an active portion of a gate refers to that portion of a gate line or structure disposed over (from a plan view perspective) an active or diffusion region of an underlying substrate. In an embodiment, reference to an inactive portion of a gate refers to that portion of a gate line or structure disposed over (from a plan view perspective) an isolation region of an underlying substrate.

In an embodiment, the semiconductor structure or device 1100 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 1108A and 1108B surround at least a top surface and a pair of sidewalls of the three-dimensional body. In another embodiment, at least the channel region is made to be a discrete three-dimensional body, such as in a gate-all-around device. In one such embodiment, the gate electrode stacks of gate lines 1108A and 1108B each completely surrounds the channel region.

Generally, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact (GCN) layer to conduct signals from a gate line or structure. In an embodiment, eliminating the above features is achieved by recessing contact metals in a trench contact (TCN) and introducing an additional dielectric material in the process flow (e.g., trench insulating layer (TILA)). The additional dielectric material is included as a trench contact dielectric cap layer with etch characteristics different from the gate dielectric material cap layer used for trench contact alignment in a gate aligned contact process (GAP) processing scheme (e.g., use of a gate insulating layer (GILA)).

As an exemplary fabrication scheme, a starting structure includes one or more gate stack structures disposed above a substrate. The gate stack structures may include a gate dielectric layer and a gate electrode. Trench contacts, e.g., contacts to diffusion regions of the substrate or to epitaxial region formed within the substrate are spaced apart from gate stack structures by dielectric spacers. An insulating cap layer may be disposed on the gate stack structures (e.g., GILA). In one embodiment, contact blocking regions or "contact plugs", which may be fabricated from an inter-layer dielectric material, are included in regions where contact formation is to be blocked.

In an embodiment, the contact pattern is essentially perfectly aligned to an existing gate pattern while eliminating the use of a lithographic operation with exceedingly tight registration budget. In one such embodiment, this approach enables the use of intrinsically highly selective wet etching (or anisotropic dry etch processes some of which are non-plasma, gas phase isotropic etches (e.g., versus classic dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. This also allows for perfect or near-perfect self-alignment with a larger edge placement error margin. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, the gate stack structures may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including $SF_6$. In another embodiment, dummy gates are composed of polycrystalline silicon or amorphous silicon and are removed with a wet etch process including aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

Next, the trench contacts may be recessed to provide recessed trench contacts that have a height below the top surface of adjacent spacers. An insulating cap layer is then formed on the recessed trench contacts (e.g., TILA). In accordance with an embodiment of the present disclosure, the insulating cap layer on the recessed trench contacts is composed of a material having a different etch characteristic than insulating cap layer on the gate stack structures.

The trench contacts may be recessed by a process selective to the materials of the spacers and the gate insulating cap layer. For example, in one embodiment, the trench contacts are recessed by an etch process such as a wet etch process or dry etch process. The trench contact insulating cap layer may be formed by a process suitable to provide a conformal and sealing layer above the exposed portions of the trench contacts. For example, in one embodiment, the trench contact insulating cap layer is formed by a chemical vapor deposition (CVD) process as a conformal layer above the entire structure. The conformal layer is then planarized, e.g., by chemical mechanical polishing (CMP), to provide the trench contact insulating cap layer material only above the recessed trench contacts.

Regarding suitable material combinations for gate or trench contact insulating cap layers, in one embodiment, one of the pair of gate versus trench contact insulating cap material is composed of silicon oxide while the other is composed of silicon nitride. In another embodiment, one of the pair of gate versus trench contact insulating cap material is composed of silicon oxide while the other is composed of carbon doped silicon nitride. In another embodiment, one of the pair of gate versus trench contact insulating cap material is composed of silicon oxide while the other is composed of silicon carbide. In another embodiment, one of the pair of gate versus trench contact insulating cap material is composed of silicon nitride while the other is composed of carbon doped silicon nitride. In another embodiment, one of the pair of gate versus trench contact insulating cap material is composed of silicon nitride while the other is composed of silicon carbide. In another embodiment, one of the pair of gate versus trench contact insulating cap material is composed of carbon doped silicon nitride while the other is composed of silicon carbide.

In another aspect, nanowire or nanoribbon structures are described. Nanowire or nanoribbon release processing may be performed through a replacement gate trench. Examples of such release processes are described below. Additionally, in yet another aspect, backend (BE) interconnect scaling can result in lower performance and higher manufacturing cost due to patterning complexity. Embodiments described herein may be implemented to enable front-side and back-side interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a back-side interconnect level.

As an exemplary process flow for fabricating another gate-all-around device, FIGS. 12A-12J illustrates cross-sectional views of various operations in a method of fabricating a gate-all-around integrated circuit structure, in accordance with an embodiment of the present disclosure.

Figure 12B:
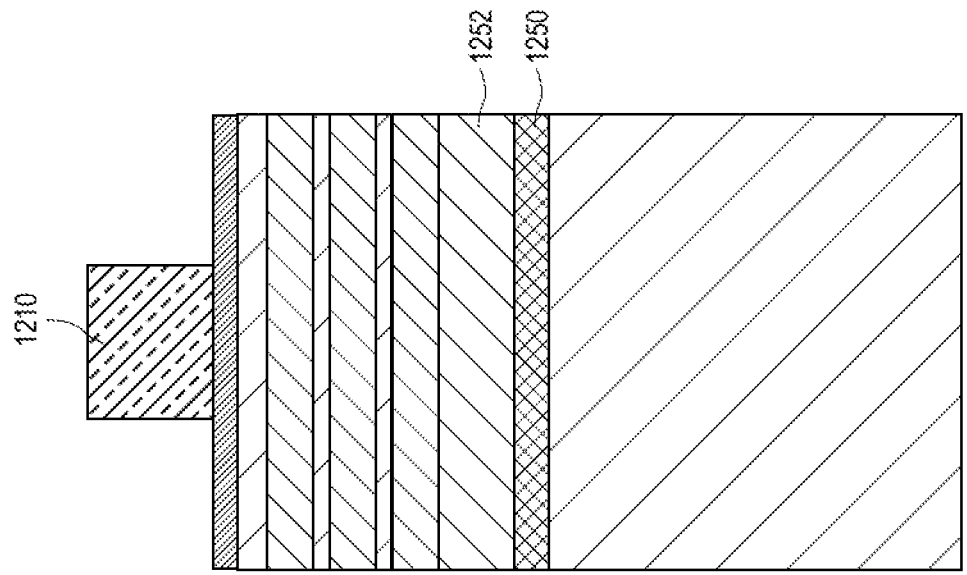
Figure 12A:
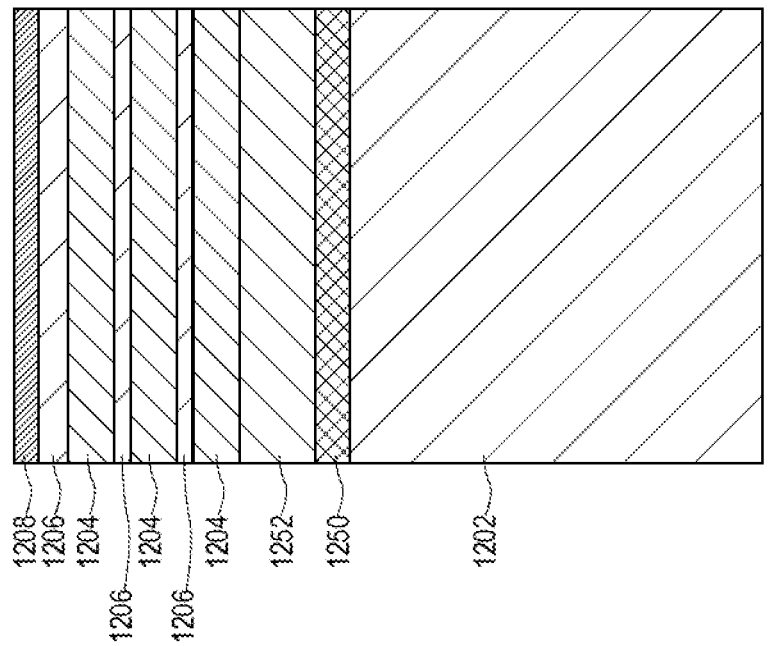

Referring to FIG. 12A, a method of fabricating an integrated circuit structure includes forming a starting stack which includes alternating sacrificial layers 1204 and nanowires 1206 above a fin 1202, such as a silicon fin. The nanowires 1206 may be referred to as a vertical arrangement of nanowires. A protective cap 1208 may be formed above the alternating sacrificial layers 1204 and nanowires 1206, as is depicted. A relaxed buffer layer 1252 and a defect modification layer 1250 may be formed beneath the alternating sacrificial layers 1204 and nanowires 1206, as is also depicted.

Figure 12C:
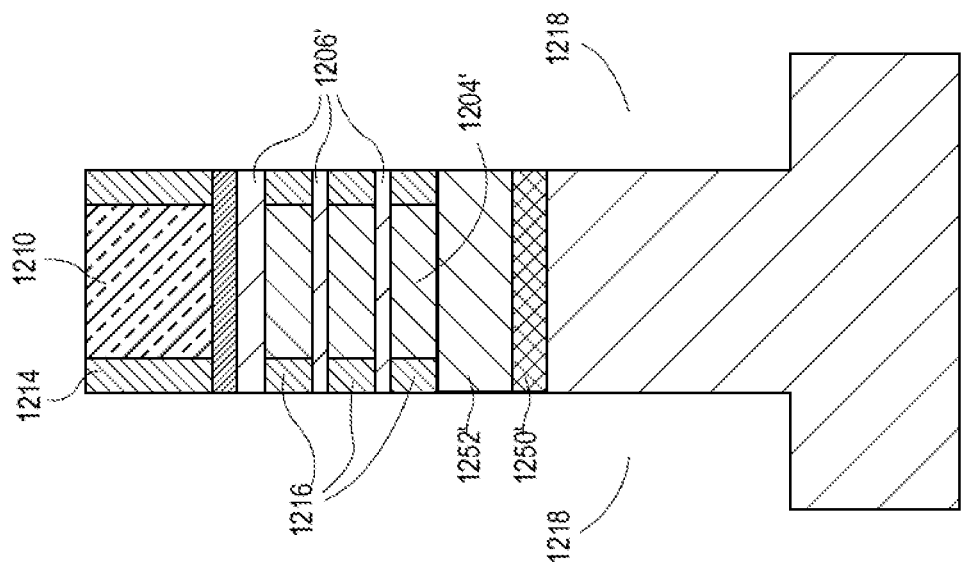

Referring to FIG. 12B, a gate stack 1210 is formed over the vertical arrangement of horizontal nanowires 1206. Portions of the vertical arrangement of horizontal nanowires 1206 are then released by removing portions of the sacrificial layers 1204 to provide recessed sacrificial layers 1204' and cavities 1212, as is depicted in FIG. 12C.

It is to be appreciated that the structure of FIG. 12C may be fabricated to completion without first performing the deep etch and asymmetric contact processing described below. In either case (e.g., with or without asymmetric contact processing), in an embodiment, a fabrication process involves use of a process scheme that provides a gate-all-around integrated circuit structure having epitaxial nubs, which may be vertically discrete source or drain structures.

Figure 12D:
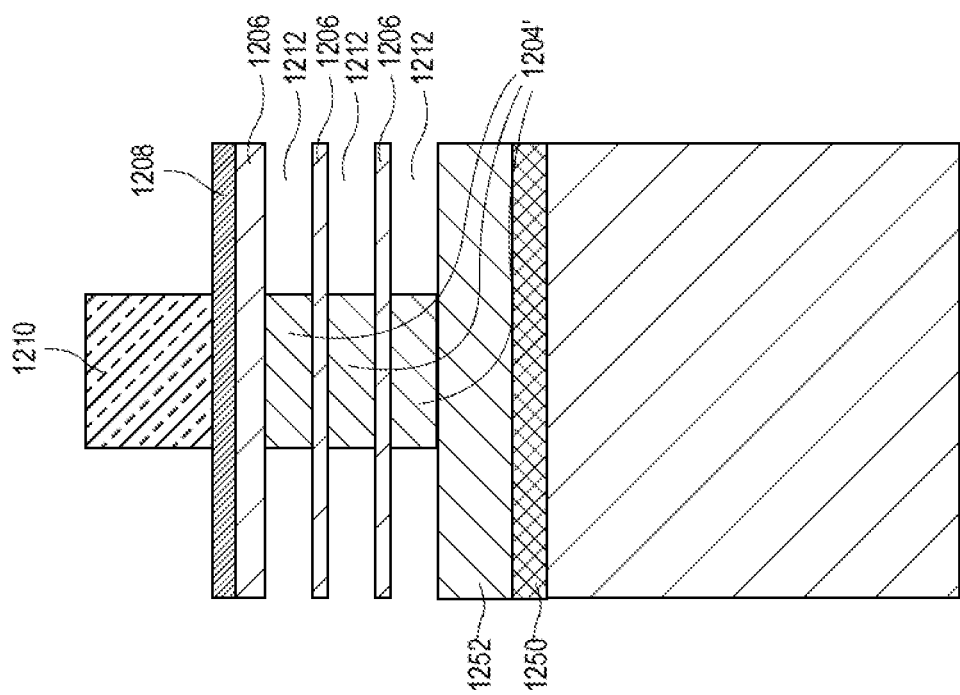

Referring to FIG. 12D, upper gate spacers 1214 are formed at sidewalls of the gate structure 1210. Cavity spacers 1216 are formed in the cavities 1212 beneath the upper gate spacers 1214. A deep trench contact etch is then optionally performed to form trenches 1218 and to form recessed nanowires 1206'. A patterned relaxed buffer layer 1252' and a patterned defect modification layer 1250' may also be present, as is depicted.

A sacrificial material 1220 is then formed in the trenches 1218, as is depicted in FIG. 12E. In other process schemes, an isolated trench bottom or silicon trench bottom may be used.

Referring to FIG. 12F, a first epitaxial source or drain structure (e.g., left-hand features 1222) is formed at a first end of the vertical arrangement of horizontal nanowires 1206'. A second epitaxial source or drain structure (e.g., right-hand features 1222) is formed at a second end of the vertical arrangement of horizontal nanowires 1206'. In an embodiment, as depicted, the epitaxial source or drain structures 1222 are vertically discrete source or drain structures and may be referred to as epitaxial nubs.

An inter-layer dielectric (ILD) material 1224 is then formed at the sides of the gate electrode 1210 and adjacent the source or drain structures 1222, as is depicted in FIG. 12G. Referring to FIG. 12H, a replacement gate process is used to form a permanent gate dielectric 1228 and a permanent gate electrode 1226. The ILD material 1224 is then removed, as is depicted in FIG. 12I. The sacrificial material 1220 is then removed from one of the source drain locations (e.g., right-hand side) to form trench 1232, but is not removed from the other of the source drain locations to form trench 1230.

Referring to FIG. 12J, a first conductive contact structure 1234 is formed coupled to the first epitaxial source or drain structure (e.g., left-hand features 1222). A second conductive contact structure 1236 is formed coupled to the second epitaxial source or drain structure (e.g., right-hand features 1222). The second conductive contact structure 1236 is formed deeper along the fin 1202 than the first conductive contact structure 1234. In an embodiment, although not depicted in FIG. 12J, the method further includes forming an exposed surface of the second conductive contact structure 1236 at a bottom of the fin 1202. Conductive contacts may include a contact resistance reducing layer and a primary contact electrode layer, where examples can include Ti, Ni, Co (for the former and W, Ru, Co for the latter.)

In an embodiment, the second conductive contact structure 1236 is deeper along the fin 1202 than the first conductive contact structure 1234, as is depicted. In one such embodiment, the first conductive contact structure 1234 is not along the fin 1202, as is depicted. In another such embodiment, not depicted, the first conductive contact structure 1234 is partially along the fin 1202.

In an embodiment, the second conductive contact structure 1236 is along an entirety of the fin 1202. In an embodiment, although not depicted, in the case that the bottom of the fin 1202 is exposed by a back-side substrate removal process, the second conductive contact structure 1236 has an exposed surface at a bottom of the fin 1202.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back-side, and again employed in back-side fabrication. Processing of both a front-side and revealed back-side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 μm in thickness, 100-700 μm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate: intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectivity (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, back-side processing may commence on an exposed back-side of the device layer or specific device regions there in. In some embodiments, the back-side device layer processing includes a further polish or wet/dry etch through a thickness of the device layer disposed between the intervening layer and a device region previously fabricated in the device layer, such as a source or drain region.

In some embodiments where the carrier layer, intervening layer, or device layer back-side is recessed with a wet and/or plasma etch, such an etch may be a patterned etch or a materially selective etch that imparts significant non-planarity or topography into the device layer back-side surface. As described further below, the patterning may be within a device cell (i.e., "intra-cell" patterning) or may be across device cells (i.e., "inter-cell" patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back-side of an intervening layer, a back-side of the device layer, and/or back-side of one or more semiconductor regions within the device layer, and/or front-side metallization revealed. Additional back-side processing of any of these revealed regions may then be performed during downstream processing.

As described throughout the present application, a substrate may be composed of a semiconductor material that can withstand a manufacturing process and in which charge can migrate. In an embodiment, a substrate is described herein is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in such a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a group III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a group III-V material and the charge-carrier dopant impurity atoms are ones such as, but not limited to, carbon, silicon, germanium, oxygen, sulfur, selenium or tellurium.

As described throughout the present application, isolation regions such as shallow trench isolation regions or sub-fin isolation regions may be composed of a material suitable to ultimately electrically isolate, or contribute to the isolation of, portions of a permanent gate structure from an underlying bulk substrate or to isolate active regions formed within an underlying bulk substrate, such as isolating fin active regions. For example, in one embodiment, an isolation region is composed of one or more layers of a dielectric material such as, but not limited to, silicon dioxide, silicon oxy-nitride, silicon nitride, carbon-doped silicon nitride, or a combination thereof.

As described throughout the present application, gate lines or gate structures may be composed of a gate electrode stack which includes a gate dielectric layer and a gate electrode layer. In an embodiment, the gate electrode of the gate electrode stack is composed of a metal gate and the gate dielectric layer is composed of a high-k material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of a semiconductor substrate. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, a gate electrode is composed of a metal layer such as, but not limited to, metal nitrides, metal carbides, metal silicides, metal aluminides, hafnium, zirconium, titanium, tantalum, aluminum, ruthenium, palladium, platinum, cobalt, nickel or conductive metal oxides. In a specific embodiment, the gate electrode is composed of a non-workfunction-setting fill material formed above a metal workfunction-setting layer. The gate electrode layer may consist of a P-type workfunction metal or an N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a conductive fill layer. For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

As described throughout the present application, spacers associated with gate lines or electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In an embodiment, approaches described herein may involve formation of a contact pattern which is very well aligned to an existing gate pattern while eliminating the use of a lithographic operation with exceedingly tight registration budget. In one such embodiment, this approach enables the use of intrinsically highly selective wet etching (e.g., versus dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in other approaches. In an embodiment, a trench contact grid is not separately patterned, but is rather formed between poly (gate) lines. For example, in one such embodiment, a trench contact grid is formed subsequent to gate grating patterning but prior to gate grating cuts.

Furthermore, a gate stack structure may be fabricated by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

In an embodiment, one or more approaches described herein contemplate essentially a dummy and replacement gate process in combination with a dummy and replacement contact process to arrive at structure. In one such embodiment, the replacement contact process is performed after the replacement gate process to allow high temperature anneal of at least a portion of the permanent gate stack. For example, in a specific such embodiment, an anneal of at least a portion of the permanent gate structures, e.g., after a gate dielectric layer is formed, is performed at a temperature greater than approximately 600 degrees Celsius. The anneal is performed prior to formation of the permanent contacts.

In some embodiments, the arrangement of a semiconductor structure or device places a gate contact over portions of a gate line or gate stack over isolation regions. However, such an arrangement may be viewed as inefficient use of layout space. In another embodiment, a semiconductor device has contact structures that contact portions of a gate electrode formed over an active region. In general, prior to (e.g., in addition to) forming a gate contact structure (such as a via) over an active portion of a gate and in a same layer as a trench contact via, one or more embodiments of the present disclosure include first using a gate aligned trench contact process. Such a process may be implemented to form trench contact structures for semiconductor structure fabrication, e.g., for integrated circuit fabrication. In an embodiment, a trench contact pattern is formed as aligned to an existing gate pattern. By contrast, other approaches typically involve an additional lithography process with tight registration of a lithographic contact pattern to an existing gate pattern in combination with selective contact etches. For example, another process may include patterning of a poly (gate) grid with separate patterning of contact features.

It is to be appreciated that pitch division processing and patterning schemes may be implemented to enable embodiments described herein or may be included as part of embodiments described herein. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a predefined pitch. Pitch division processing is then implemented as a technique to increase line density.

In an embodiment, the term "grating structure" for fins, gate lines, metal lines, ILD lines or hardmask lines is used herein to refer to a tight pitch grating structure. In one such embodiment, the tight pitch is not achievable directly through a selected lithography. For example, a pattern based on a selected lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a substantially consistent pitch and having a substantially consistent width. For example, in some embodiments the pitch variation would be within ten percent and the width variation would be within ten percent, and in some embodiments, the pitch variation would be within five percent and the width variation would be within five percent. The pattern may be fabricated by a pitch halving or pitch quartering, or other pitch division, approach. In an embodiment, the grating is not necessarily single pitch.

In an embodiment, a blanket film is patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented. In any case, in an embodiment, a gridded layout may be fabricated by a selected lithography approach, such as 193 nm immersion lithography (193i). Pitch division may be implemented to increase the density of lines in the gridded layout by a factor of n. Gridded layout formation with 193i lithography plus pitch division by a factor of 'n' can be designated as 193i+P/n Pitch Division. In one such embodiment, 193 nm immersion scaling can be extended for many generations with cost effective pitch division.

It is also to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices.

For example, in an embodiment, the semiconductor devices are a metal-oxide semiconductor (MOS) transistors for logic or memory, or are bipolar transistors. Also, in an embodiment, the semiconductor devices have a three-dimensional architecture, such as a trigate device, an independently accessed double gate device, a FIN-FET, a nanowire, or a nanoribbon. One or more embodiments may be particularly useful for fabricating semiconductor devices at a 10 nanometer (10 nm) technology node or sub-10 nanometer (10 nm) technology node.

Additional or intermediate operations for FEOL layer or structure fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed, or both.

Embodiments disclosed herein may be used to manufacture a wide variety of different types of integrated circuits or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 13:
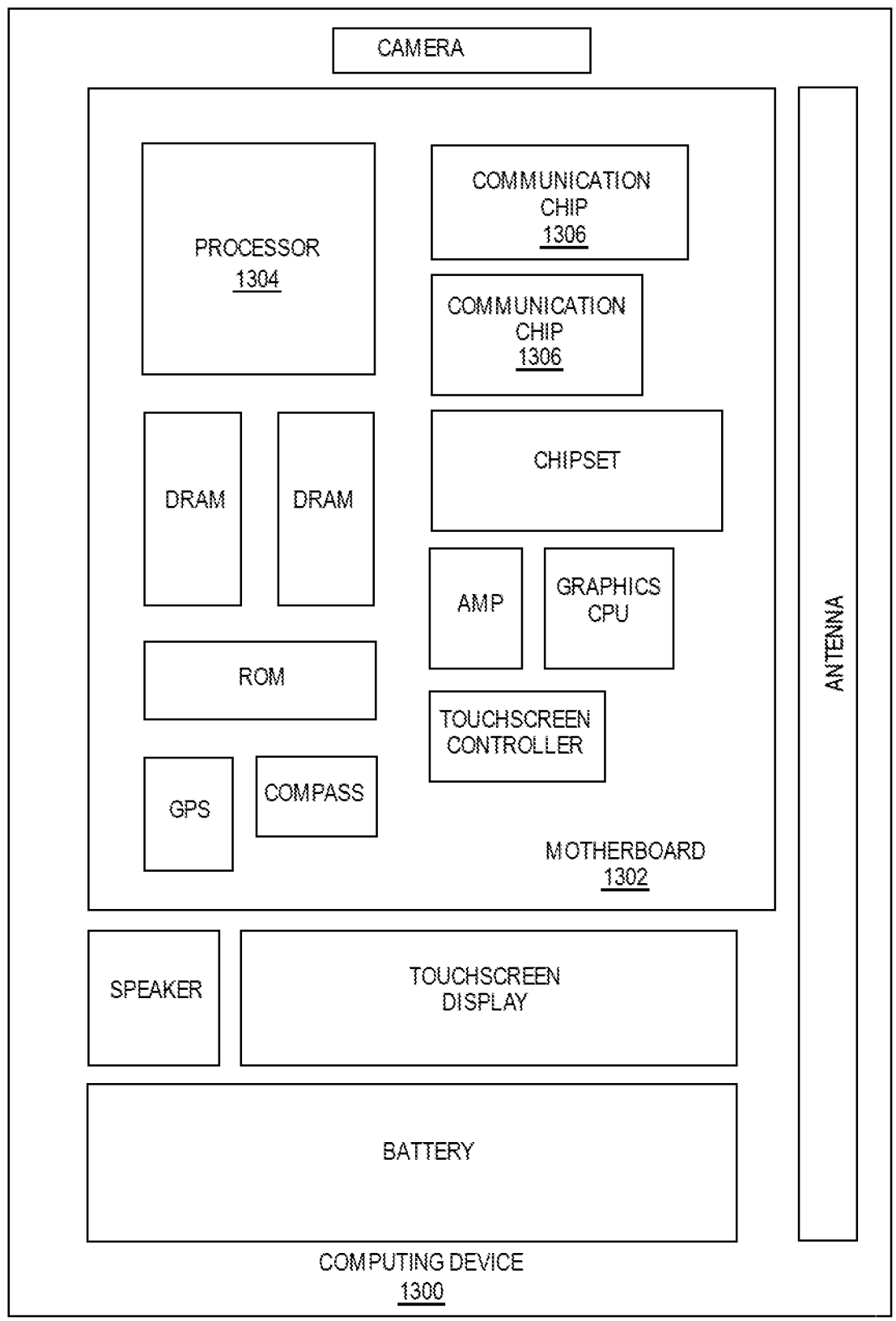
FIG. 13 illustrates a computing device in accordance with one implementation of the disclosure.

FIG. 13 illustrates a computing device 1300 in accordance with one implementation of the disclosure. The computing device 1300 houses a board 1302. The board 1302 may include a number of components, including but not limited to a processor 1304 and at least one communication chip 1306. The processor 1304 is physically and electrically coupled to the board 1302. In some implementations the at least one communication chip 1306 is also physically and electrically coupled to the board 1302. In further implementations, the communication chip 1306 is part of the processor 1304.

Depending on its applications, computing device 1300 may include other components that may or may not be physically and electrically coupled to the board 1302. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1306 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1306. For instance, a first communication chip 1306 may be dedicated to shorter range wireless communications such as Wi-Fi and Bluetooth and a second communication chip 1306 may be dedicated to longer range wireless communications such as GPS, EDGE, GPRS, CDMA, WiMAX, LTE, Ev-DO, and others.

The processor 1304 of the computing device 1300 includes an integrated circuit die packaged within the processor 1304. In some implementations of embodiments of the disclosure, the integrated circuit die of the processor includes one or more structures, such as integrated circuit structures built in accordance with implementations of the disclosure. The term "processor" may refer to any device or portion of a device that processes electronic data from registers or memory to transform that electronic data, or both, into other electronic data that may be stored in registers or memory, or both.

The communication chip 1306 also includes an integrated circuit die packaged within the communication chip 1306. In accordance with another implementation of the disclosure, the integrated circuit die of the communication chip is built in accordance with implementations of the disclosure.

In further implementations, another component housed within the computing device 1300 may contain an integrated circuit die built in accordance with implementations of embodiments of the disclosure.

In various embodiments, the computing device 1300 may be a laptop, a netbook, a notebook, an ultrabook, a smartphone, a tablet, a personal digital assistant (PDA), an ultramobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

Figure 14:
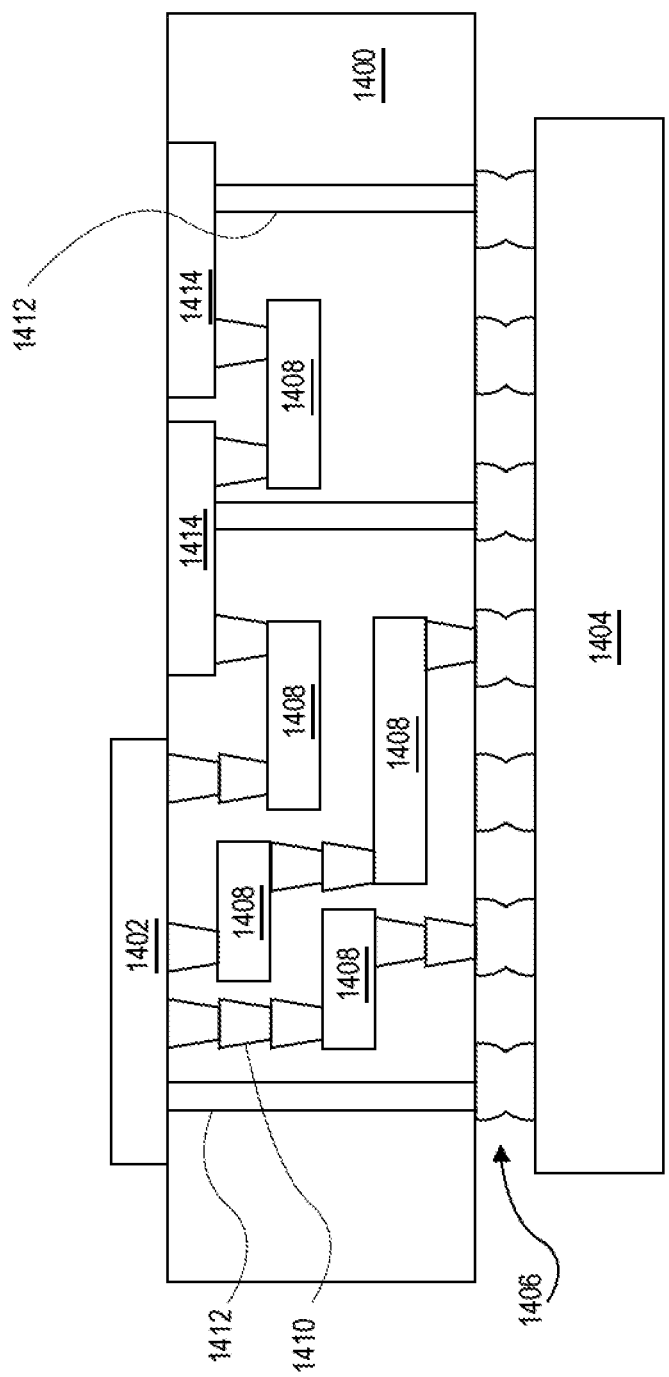
FIG. 14 illustrates an interposer that includes one or more embodiments of the disclosure.

FIG. 14 illustrates an interposer 1400 that includes one or more embodiments of the disclosure. The interposer 1400 is an intervening substrate used to bridge a first substrate 1402 to a second substrate 1404. The first substrate 1402 may be, for instance, an integrated circuit die. The second substrate 1404 may be, for instance, a memory module, a computer motherboard, or another integrated circuit die. Generally, the purpose of an interposer 1400 is to spread a connection to a wider pitch or to reroute a connection to a different connection. For example, an interposer 1400 may couple an integrated circuit die to a ball grid array (BGA) 1406 that can subsequently be coupled to the second substrate 1404. In some embodiments, the first and second substrates 1402/1404 are attached to opposing sides of the interposer 1400. In other embodiments, the first and second substrates 1402/1404 are attached to the same side of the interposer 1400. And in further embodiments, three or more substrates are interconnected by way of the interposer 1400.

The interposer 1400 may be formed of an epoxy resin, a fiberglass-reinforced epoxy resin, a ceramic material, or a polymer material such as polyimide. In further implementations, the interposer 1400 may be formed of alternate rigid or flexible materials that may include the same materials described above for use in a semiconductor substrate, such as silicon, germanium, and other group III-V and group IV materials.

The interposer 1400 may include metal interconnects 1408 and vias 1410, including but not limited to through-silicon vias (TSVs) 1412. The interposer 1400 may further include embedded devices 1414, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1400. In accordance with embodiments of the disclosure, apparatuses or processes disclosed herein may be used in the fabrication of interposer 1400 or in the fabrication of components included in the interposer 1400.

Figure 15:
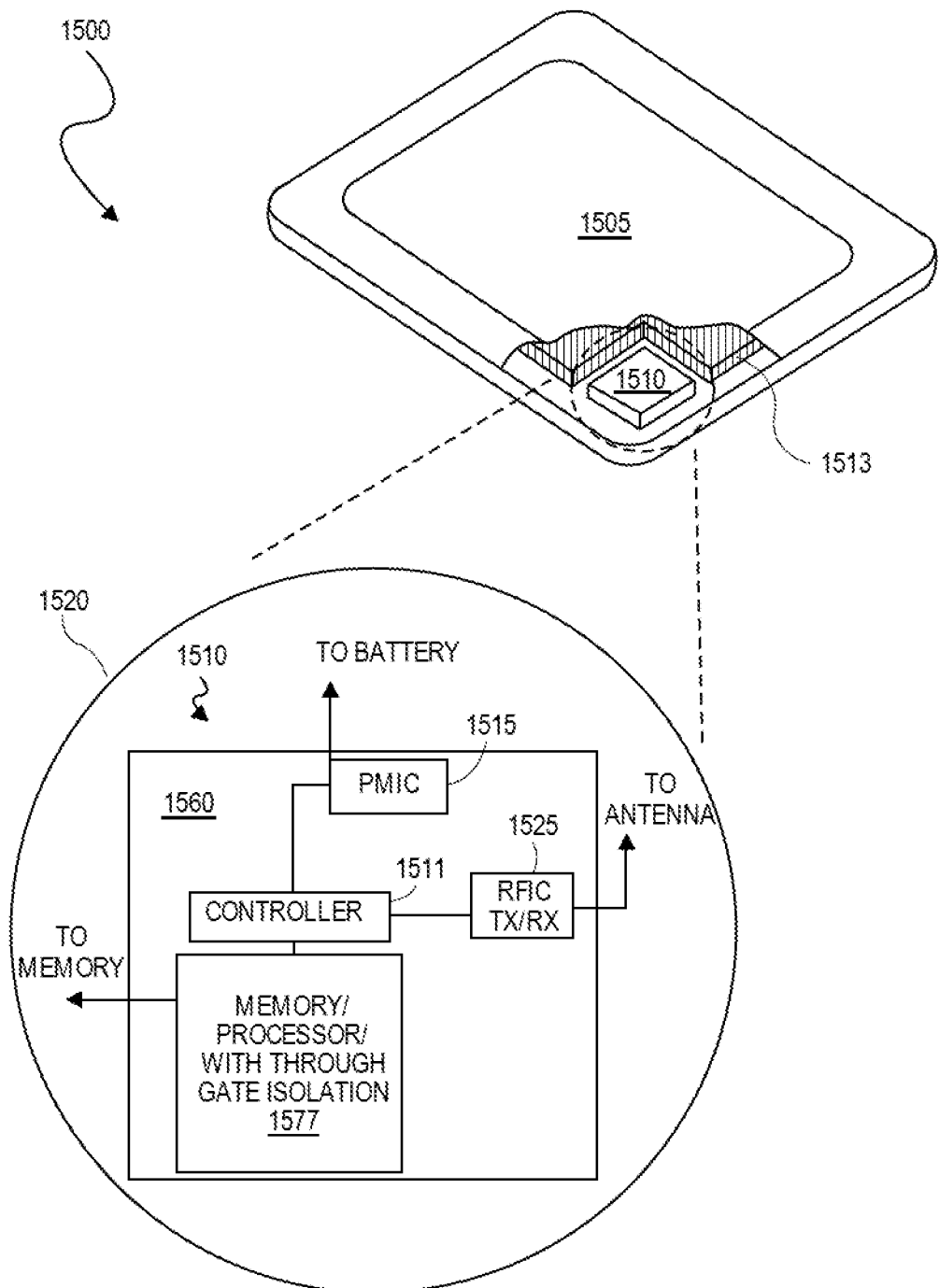
FIG. 15 is an isometric view of a mobile computing platform employing an IC fabricated according to one or more processes described herein or including one or more features described herein, in accordance with an embodiment of the present disclosure.

FIG. 15 is an isometric view of a mobile computing platform 1500 employing an integrated circuit (IC) fabricated according to one or more processes described herein or including one or more features described herein, in accordance with an embodiment of the present disclosure.

The mobile computing platform 1500 may be any portable device configured for each of electronic data display, electronic data processing, and wireless electronic data transmission. For example, mobile computing platform 1500 may be any of a tablet, a smart phone, laptop computer, etc. and includes a display screen 1505 which in the exemplary embodiment is a touchscreen (capacitive, inductive, resistive, etc.), a chip-level (SoC) or package-level integrated system 1510, and a battery 1513. As illustrated, the greater the level of integration in the system 1510 enabled by higher transistor packing density, the greater the portion of the mobile computing platform 1500 that may be occupied by the battery 1513 or non-volatile storage, such as a solid state drive, or the greater the transistor gate count for improved platform functionality. Similarly, the greater the carrier mobility of each transistor in the system 1510, the greater the functionality. As such, techniques described herein may enable performance and form factor improvements in the mobile computing platform 1500.

The integrated system 1510 is further illustrated in the expanded view 1520. In the exemplary embodiment, packaged device 1577 includes at least one memory chip (e.g., RAM), or at least one processor chip (e.g., a multi-core microprocessor and/or graphics processor) fabricated according to one or more processes described herein or including one or more features described herein. The packaged device 1577 is further coupled to the board 1560 along with one or more of a power management integrated circuit (PMIC) 1515, RF (wireless) integrated circuit (RFIC) 1525 including a wideband RF (wireless) transmitter and/or receiver (e.g., including a digital baseband and an analog front end module further includes a power amplifier on a transmit path and a low noise amplifier on a receive path), and a controller thereof 1511. Functionally, the PMIC 1515 performs battery power regulation, DC-to-DC conversion, etc., and so has an input coupled to the battery 1513 and with an output providing a current supply to all the other functional modules. As further illustrated, in the exemplary embodiment, the RFIC 1525 has an output coupled to an antenna to provide to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. In alternative implementations, each of these board-level modules may be integrated onto separate ICs coupled to the package substrate of the packaged device 1577 or within a single IC (SoC) coupled to the package substrate of the packaged device 1577.

In another aspect, semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

In an embodiment, wire bonding to a ceramic or organic package substrate is used. In another embodiment, a C4 process is used to mount a die to a ceramic or organic package substrate. In particular, C4 solder ball connections can be implemented to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over with the active side facing down on the mounting area. The solder bumps are used to connect the semiconductor device directly to the substrate.

Figure 16:
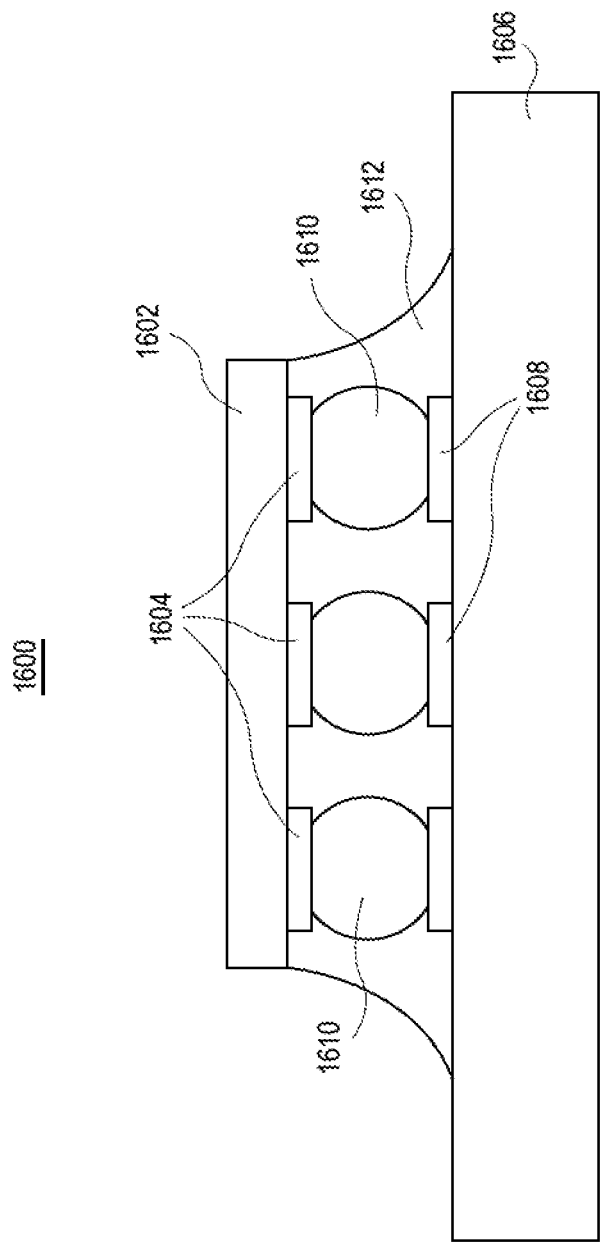
FIG. 16 illustrates a cross-sectional view of a flip-chip mounted die, in accordance with an embodiment of the present disclosure.

FIG. 16 illustrates a cross-sectional view of a flip-chip mounted die, in accordance with an embodiment of the present disclosure.

Referring to FIG. 16, an apparatus 1600 includes a die 1602 such as an integrated circuit (IC) fabricated according to one or more processes described herein or including one or more features described herein, in accordance with an embodiment of the present disclosure. The die 1602 includes metallized pads 1604 thereon. A package substrate 1606, such as a ceramic or organic substrate, includes connections 1608 thereon. The die 1602 and package substrate 1606 are electrically connected by solder balls 1610 coupled to the metallized pads 1604 and the connections 1608. An underfill material 1612 surrounds the solder balls 1610.

Processing a flip chip may be similar to conventional IC fabrication, with a few additional operations. Near the end of the manufacturing process, the attachment pads are metalized to make them more receptive to solder. This typically consists of several treatments. A small dot of solder is then deposited on each metalized pad. The chips are then cut out of the wafer as normal. To attach the flip chip into a circuit, the chip is inverted to bring the solder dots down onto connectors on the underlying electronics or circuit board. The solder is then re-melted to produce an electrical connection, typically using an ultrasonic or alternatively reflow solder process. This also leaves a small space between the chip's circuitry and the underlying mounting. In most cases an electrically-insulating adhesive is then "underfilled" to provide a stronger mechanical connection, provide a heat bridge, and to ensure the solder joints are not stressed due to differential heating of the chip and the rest of the system.

In other embodiments, newer packaging and die-to-die interconnect approaches, such as through silicon via (TSV) and silicon interposer, are implemented to fabricate high performance Multi-Chip Module (MCM) and System in Package (SiP) incorporating an integrated circuit (IC) fabricated according to one or more processes described herein or including one or more features described herein, in accordance with an embodiment of the present disclosure.

Thus, embodiments of the present disclosure include integrated circuit structures having front side signal lines and backside power delivery.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of the present disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of the present application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

The following examples pertain to further embodiments. The various features of the different embodiments may be variously combined with some features included and others excluded to suit a variety of different applications.

Example embodiment 1: An integrated circuit structure includes a plurality of gate lines extending over a plurality of semiconductor nanowire stack channel structures within a cell boundary, the plurality of gate lines having a pitch. A plurality of trench contacts is extending over a plurality of source or drain structures within the cell boundary, individual ones of the plurality of trench contacts alternating with individual ones of the plurality of gate lines. A first signal line, a second signal line, a third signal line, and a fourth signal line are over the plurality of gate lines and the plurality of trench contacts within the cell boundary, the first, second, third and fourth signal lines having a minimum pitch of 1.5 times the pitch. A backside power delivery line is beneath the plurality of semiconductor nanowire stack channel structures and the plurality of source or drain structures, the backside power delivery line coupled to one of the plurality of trench contacts within the cell boundary.

Example embodiment 2: The integrated circuit structure of example embodiment 1, wherein the backside power delivery line is coupled to the one or more of the plurality of trench contacts by a through-silicon via.

Example embodiment 3: The integrated circuit structure of example embodiment 1 or 2, wherein one of the first, second, third and fourth signal lines is coupled to one of the plurality of gate lines over one of the plurality of semiconductor nanowire stack channel structures from a plan view perspective.

Example embodiment 4: The integrated circuit structure of example embodiment 1, 2 or 3, further including a plurality of conductive lines above the first, second, third and fourth signal lines within the cell boundary, the plurality of conductive lines having the pitch.

Example embodiment 5: The integrated circuit structure of example embodiment 1, 2, 3 or 4, wherein an end-to-end (ETE) of the cell boundary is centered on the plurality of gate lines.

Example embodiment 6: The integrated circuit structure of example embodiment 1, 2, 3 or 4, wherein an end-to-end (ETE) of the cell boundary is centered on the plurality of trench contacts.

Example embodiment 7: An integrated circuit structure includes a plurality of gate lines extending over a plurality of semiconductor fin channel structures within a cell boundary, the plurality of gate lines having a pitch. A plurality of trench contacts is extending over a plurality of source or drain structures within the cell boundary, individual ones of the plurality of trench contacts alternating with individual ones of the plurality of gate lines. A first signal line, a second signal line, a third signal line, and a fourth signal line are over the plurality of gate lines and the plurality of trench contacts within the cell boundary, the first, second, third and fourth signal lines having a minimum pitch of 1.5 times the pitch. A backside power delivery line is beneath the plurality of semiconductor fin channel structures and the plurality of source or drain structures, the backside power delivery line coupled to one of the plurality of trench contacts within the cell boundary.

Example embodiment 8: The integrated circuit structure of example embodiment 7, wherein the backside power delivery line is coupled to the one or more of the plurality of trench contacts by a through-silicon via.

Example embodiment 9: The integrated circuit structure of example embodiment 7 or 8, wherein one of the first, second, third and fourth signal lines is coupled to one of the plurality of gate lines over one of the plurality of semiconductor fin channel structures from a plan view perspective.

Example embodiment 10: The integrated circuit structure of example embodiment 7, 8 or 9, further including a plurality of conductive lines above the first, second, third and fourth signal lines within the cell boundary, the plurality of conductive lines having the pitch.

Example embodiment 11: The integrated circuit structure of example embodiment 7, 8, 9 or 10, wherein an end-to-end (ETE) of the cell boundary is centered on the plurality of gate lines.

Example embodiment 12: The integrated circuit structure of example embodiment 7, 8, 9 or 10, wherein an end-to-end (ETE) of the cell boundary is centered on the plurality of trench contacts.

Example embodiment 13: A computing device includes a board, and a component coupled to the board. The component includes an integrated circuit structure including a plurality of gate lines extending over a plurality of semiconductor nanowire stack channel structures within a cell boundary, the plurality of gate lines having a pitch. A plurality of trench contacts is extending over a plurality of source or drain structures within the cell boundary, individual ones of the plurality of trench contacts alternating with individual ones of the plurality of gate lines. A first signal line, a second signal line, a third signal line, and a fourth signal line are over the plurality of gate lines and the plurality of trench contacts within the cell boundary, the first, second, third and fourth signal lines having a minimum pitch of 1.5 times the pitch. A backside power delivery line is beneath the plurality of semiconductor nanowire stack channel structures and the plurality of source or drain structures, the backside power delivery line coupled to one of the plurality of trench contacts within the cell boundary.

Example embodiment 14: The computing device of example embodiment 13, further including a memory coupled to the board.

Example embodiment 15: The computing device of example embodiment 13 or 14, further including a communication chip coupled to the board.

Example embodiment 16: The computing device of example embodiment 13, 14 or 15, further including a camera coupled to the board.

Example embodiment 17: The computing device of example embodiment 13, 14, 15 or 16, wherein the component is a packaged integrated circuit die.

Example embodiment 18: A computing device includes a board, and a component coupled to the board. The component includes an integrated circuit structure including a plurality of gate lines extending over a plurality of semiconductor fin channel structures within a cell boundary, the plurality of gate lines having a pitch. A plurality of trench contacts is extending over a plurality of source or drain structures within the cell boundary, individual ones of the plurality of trench contacts alternating with individual ones of the plurality of gate lines. A first signal line, a second signal line, a third signal line, and a fourth signal line are over the plurality of gate lines and the plurality of trench contacts within the cell boundary, the first, second, third and fourth signal lines having a minimum pitch of 1.5 times the pitch. A backside power delivery line is beneath the plurality of semiconductor fin channel structures and the plurality of source or drain structures, the backside power delivery line coupled to one of the plurality of trench contacts within the cell boundary.

Example embodiment 19: The computing device of example embodiment 18, further including a memory coupled to the board.

Example embodiment 20: The computing device of example embodiment 18 or 19, further including a communication chip coupled to the board.

Example embodiment 21: The computing device of example embodiment 18, 19 or 20, further including a camera coupled to the board.

Example embodiment 22: The computing device of example embodiment 18, 19, 20 or 21, wherein the component is a packaged integrated circuit die.

What is claimed is:

1. An integrated circuit structure, comprising:
    a plurality of gate lines extending over a plurality of semiconductor nanowire stack channel structures within a cell boundary, the plurality of gate lines having a pitch;
    a plurality of trench contacts extending over a plurality of source or drain structures within the cell boundary, individual ones of the plurality of trench contacts alternating with individual ones of the plurality of gate lines;
    a first signal line, a second signal line, a third signal line, and a fourth signal line over the plurality of gate lines and the plurality of trench contacts within the cell boundary, the first, second, third and fourth signal lines having a minimum pitch of 1.5 times the pitch; and
    a backside power delivery line beneath the plurality of semiconductor nanowire stack channel structures and the plurality of source or drain structures, the backside power delivery line coupled to one of the plurality of trench contacts within the cell boundary.

2. The integrated circuit structure of claim 1, wherein the backside power delivery line is coupled to the one or more of the plurality of trench contacts by a through-silicon via.

3. The integrated circuit structure of claim 1, wherein one of the first, second, third and fourth signal lines is coupled to one of the plurality of gate lines over one of the plurality of semiconductor nanowire stack channel structures from a plan view perspective.

4. The integrated circuit structure of claim 1, further comprising:
    a plurality of conductive lines above the first, second, third and fourth signal lines within the cell boundary, the plurality of conductive lines having the pitch.

5. The integrated circuit structure of claim 1, wherein an end-to-end (ETE) of the cell boundary is centered on the plurality of gate lines.

6. The integrated circuit structure of claim 1, wherein an end-to-end (ETE) of the cell boundary is centered on the plurality of trench contacts.

7. An integrated circuit structure, comprising:
    a plurality of gate lines extending over a plurality of semiconductor fin channel structures within a cell boundary, the plurality of gate lines having a pitch;
    a plurality of trench contacts extending over a plurality of source or drain structures within the cell boundary, individual ones of the plurality of trench contacts alternating with individual ones of the plurality of gate lines;
    a first signal line, a second signal line, a third signal line, and a fourth signal line over the plurality of gate lines and the plurality of trench contacts within the cell boundary, the first, second, third and fourth signal lines having a minimum pitch of 1.5 times the pitch; and
    a backside power delivery line beneath the plurality of semiconductor fin channel structures and the plurality of source or drain structures, the backside power delivery line coupled to one of the plurality of trench contacts within the cell boundary.

8. The integrated circuit structure of claim 7, wherein the backside power delivery line is coupled to the one or more of the plurality of trench contacts by a through-silicon via.

9. The integrated circuit structure of claim 7, wherein one of the first, second, third and fourth signal lines is coupled to one of the plurality of gate lines over one of the plurality of semiconductor fin channel structures from a plan view perspective.

10. The integrated circuit structure of claim 7, further comprising:
    a plurality of conductive lines above the first, second, third and fourth signal lines within the cell boundary, the plurality of conductive lines having the pitch.

11. The integrated circuit structure of claim 7, wherein an end-to-end (ETE) of the cell boundary is centered on the plurality of gate lines.

12. The integrated circuit structure of claim 7, wherein an end-to-end (ETE) of the cell boundary is centered on the plurality of trench contacts.

13. A computing device, comprising:
    a board; and
    a component coupled to the board, the component including an integrated circuit structure, comprising:
        a plurality of gate lines extending over a plurality of semiconductor nanowire stack channel structures within a cell boundary, the plurality of gate lines having a pitch;

a plurality of trench contacts extending over a plurality of source or drain structures within the cell boundary, individual ones of the plurality of trench contacts alternating with individual ones of the plurality of gate lines;

a first signal line, a second signal line, a third signal line, and a fourth signal line over the plurality of gate lines and the plurality of trench contacts within the cell boundary, the first, second, third and fourth signal lines having a minimum pitch of 1.5 times the pitch; and a backside power delivery line beneath the plurality of semiconductor nanowire stack channel structures and the plurality of source or drain structures, the backside power delivery line coupled to one of the plurality of trench contacts within the cell boundary.

14. The computing device of claim 13, further comprising:
a memory coupled to the board.

15. The computing device of claim 13, further comprising:
a communication chip coupled to the board.

16. The computing device of claim 13, further comprising:
a camera coupled to the board.

17. The computing device of claim 13, wherein the component is a packaged integrated circuit die.

18. A computing device, comprising:
a board; and
a component coupled to the board, the component including an integrated circuit structure, comprising:

a plurality of gate lines extending over a plurality of semiconductor fin channel structures within a cell boundary, the plurality of gate lines having a pitch;

a plurality of trench contacts extending over a plurality of source or drain structures within the cell boundary, individual ones of the plurality of trench contacts alternating with individual ones of the plurality of gate lines;

a first signal line, a second signal line, a third signal line, and a fourth signal line over the plurality of gate lines and the plurality of trench contacts within the cell boundary, the first, second, third and fourth signal lines having a minimum pitch of 1.5 times the pitch; and a backside power delivery line beneath the plurality of semiconductor fin channel structures and the plurality of source or drain structures, the backside power delivery line coupled to one of the plurality of trench contacts within the cell boundary.

19. The computing device of claim 18, further comprising:
a memory coupled to the board.

20. The computing device of claim 18, further comprising:
a communication chip coupled to the board.

21. The computing device of claim 18, further comprising:
a camera coupled to the board.

22. The computing device of claim 18, wherein the component is a packaged integrated circuit die.

* * * * *